(12) United States Patent
Nozaki et al.

(10) Patent No.: US 7,611,819 B2
(45) Date of Patent: *Nov. 3, 2009

(54) RESIST COMPOSITION, METHOD FOR FORMING RESIST PATTERN, AND SEMICONDUCTOR DEVICE AND METHOD FOR MANUFACTURING THE SAME

(75) Inventors: Koji Nozaki, Kawasaki (JP); Miwa Kozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/476,172

(22) Filed: Jun. 28, 2006

(65) Prior Publication Data

US 2007/0224537 A1    Sep. 27, 2007

(30) Foreign Application Priority Data

Mar. 24, 2006    (JP)    ............................. 2006-083173

(51) Int. Cl.
*G03F 7/00*    (2006.01)
*G03F 7/004*   (2006.01)

(52) U.S. Cl. .................... 430/270.1; 430/311; 430/905; 430/913

(58) Field of Classification Search ............... 430/270.1, 430/311, 905, 913
See application file for complete search history.

(56) References Cited

U.S. PATENT DOCUMENTS

| | | | | |
|---|---|---|---|---|
| 5,858,620 | A * | 1/1999 | Ishibashi et al. | ............ 430/313 |
| 6,319,853 | B1 * | 11/2001 | Ishibashi et al. | ............ 438/780 |
| 6,436,606 | B1 * | 8/2002 | Hatakeyama et al. | .... 430/270.1 |
| 6,506,534 | B1 | 1/2003 | Nozaki et al. | |
| 6,579,657 | B1 | 6/2003 | Ishibashi et al. | |
| 6,641,961 | B2 * | 11/2003 | Takebe | ........................... 430/7 |
| 2003/0102285 | A1 | 6/2003 | Nozaki et al. | |
| 2003/0175624 | A1 | 9/2003 | Nozaki et al. | |
| 2004/0106737 | A1 | 6/2004 | Sugeta et al. | |
| 2004/0248035 | A1 | 12/2004 | Takahashi et al. | |

FOREIGN PATENT DOCUMENTS

| | | |
|---|---|---|
| CN | 1421743 A | 6/2003 |
| EP | 1 398 309 A1 | 3/2004 |
| EP | 1 491 951 A2 | 12/2004 |
| EP | 1 513 013 A2 | 3/2005 |
| JP | 10-73927 A | 3/1997 |
| JP | 2960661 B2 | 10/1999 |
| JP | 2001-154357 A | 6/2001 |
| JP | 2002-072480 A | 3/2002 |
| JP | 2003-131400 A | 5/2003 |
| JP | 2004-217867 A | 8/2004 |
| WO | WO 03/014830 A1 | 2/2003 |

OTHER PUBLICATIONS

European Search Report dated Nov. 2, 2006 issued in corresponding European Application No. EP 06 01 3346.
Chinese Office Action dated Jul. 3, 2009 (issuing date), issued in corresponding Chinese Patent Application No. 200610107443.6.

* cited by examiner

*Primary Examiner*—Amanda C. Walke
(74) *Attorney, Agent, or Firm*—Westerman, Hattori, Daniels & Adrian, LLP.

(57) ABSTRACT

The present invention provides a resist composition which enables uniformly thickening a resist pattern with a resist pattern thickening material, regardless of the direction, spacing variations of the resist pattern, and the components of the resist pattern thickening material and enables forming a fine space pattern of resist, exceeding exposure limits of light sources of exposure devices at low cost, easily, and efficiently. The resist composition contains an alicyclic compound (melting point: 90° C. to 150° C.), and a resin. The method for manufacturing a semiconductor device includes forming a resist pattern on a surface of a workpiece to be processed by using a resist composition and applying a resist pattern thickening material on the surface of the workpiece so as to cover the surface of the resist pattern to thicken the resist pattern; and patterning the surface of the workpiece by etching thereof using the thickened resist pattern as a mask.

18 Claims, 21 Drawing Sheets

Thickening of resist pattern

FIG. 26A
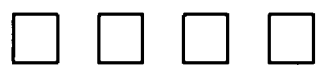
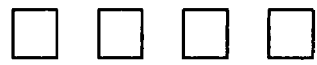
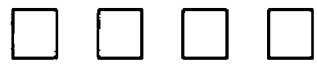
FIG. 26B
Thickening amount: large
↑ Thickening amount: small
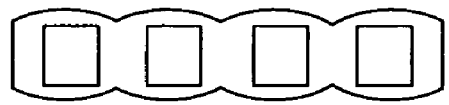
FIG. 27A

RESIST COMPOSITION, METHOD FOR FORMING RESIST PATTERN, AND SEMICONDUCTOR DEVICE AND METHOD FOR MANUFACTURING THE SAME

CROSS-REFERENCE TO RELATED APPLICATIONS

This application is based upon and claims the benefits of the priority from the prior Japanese Patent Application No. 2006-083173, filed on Mar. 24, 2006, the entire contents of which are incorporated herein by reference.

BACKGROUND OF THE INVENTION

1. Field of the Invention

The present invention relates to a composition used for a resist pattern that is formed in manufacturing a semiconductor device. The present invention also relates to a method for forming a resist pattern which includes forming a fine space pattern of resist, exceeding exposure limits (resolution limits) of light sources of available exposure devices by thickening the resist pattern; a semiconductor device, and a method for manufacturing the semiconductor device.

2. Description of the Related Art

Semiconductor integrated circuits are becoming more highly integrated, and LSIs and VLSIs are being put into practical use. Accompanying this trend, the interconnection patterns extend to regions of 0.2 μm or less, and the smallest patterns extend to regions of 0.1 μm or less. A lithographic technique is extremely important in forming fine interconnection patterns. In the lithographic technique, a substrate is coated with a resist film, is selectively exposed, and thereafter, is developed to thereby form a resist pattern. The substrate is subjected to a dry etching treatment by using the resist pattern as a mask, and thereafter, by removing the resist pattern, the desired pattern, for example, an interconnection pattern is obtained. In forming a fine interconnection pattern utilizing the lithographic technique, it is necessary to make the light source of the exposure device be a short wavelength, as well as to develop resist materials which have high resolution and are suitable to the characteristics of the light source.

However, in order to make a light source of an exposure device be a short wavelength, it is necessary to improve the exposure device, which results in very high costs. Further, the development of new resist materials suitable for an exposure with light of short wavelength is not easy.

To overcome the above technical problems, there has been proposed a technique that a resist pattern formed from a conventional resist material is thickened with a resist pattern thickening material (hereinafter, sometimes referring to as "resist swelling material") capable of forming a fine space pattern of resist. For instance, Japanese Patent Application Laid-Open (JP-A) No. 10-73927 discloses a technique called RELACS. According to the disclosure, a resist pattern is formed by exposing a resist film with an exposure light such as KrF (krypton fluoride) excimer laser light having a wavelength of 248 nm, which is a deep ultraviolet light. Thereafter, a water-soluble resin composition is applied over a surface of the resist film to form a coated film so as to cover the resist pattern. The coated film and the resist pattern are subjected to a cross-linking reaction at the interface thereof by the effect of residual acid included in the resist pattern, so as to thicken the resist pattern (hereinafter, the thickening of the resist pattern sometimes referring to as "swelling"). In this way, the spaces between the individual resist patterns are shortened, and a fine space pattern of resist is formed. Thereafter, a desired pattern (e.g. interconnection pattern) having the same dimension as the space pattern is formed.

In the RELACS technique, however, there are the following problems. The KrF resist for use is formed of an aromatic resin composition including a novolak resin, naphthoquinonediazide resin or the like. An aromatic ring contained in the aromatic resin composition allows KrF excimer laser light (wavelength: 248 nm) to pass through, but absorbs ArF excimer laser light (wavelength: 193 nm) having a shorter wavelength than the KrF excimer laser light and does not allow the ArF excimer laser light to pass through. Therefore, when the KrF resist is used, ArF excimer laser light cannot be used as the exposure light, which makes it impossible to from a fine interconnection pattern, etc. Moreover, there is a problem in the RELACS technique that the resist swelling material is effective in thickening or swelling the KrF resist, however, ineffective in thickening or swelling the ArF resist.

From the standpoint of forming a fine interconnection pattern, it is desirable to use a light of a shorter wavelength than KrF excimer laser light, e.g., ArF excimer laser light, as the light source of the exposure device. When an x-ray or electron beam having a shorter wavelength than the ArF excimer laser light is applied as exposure light to form the pattern, however, it results in high cost and low productivity. Thus, the utilization of ArF excimer laser light is desired.

As mentioned above, in the RELACS technique, the aforementioned resist swelling material does not efficiently work on ArF resist pattern. The present inventors have proposed a resist pattern thickening material capable of forming a fine pattern by improving affinity with the ArF resist pattern caused by a surfactant (see JP-A No. 2003-131400). However, the composition of this resist pattern thickening material sometimes causes dependency on the pattern size before thickening, that is, when the pattern size before thickening increases, the reduced amount of the pattern size after thickening may increase in proportion to the increase. Moreover, when a resist pattern is formed from a conventional resist composition, the resist pattern along the narrow side directions, or a region where elements of the resist pattern are sparsely located to each other, i.e. a region where space between the elements of the resist pattern is wide, has a small thickened amount, whereas the resist pattern along the wide side directions, or a region where the elements of the resist pattern are closely located to each other, i.e. a region where a space between the elements of the resist pattern is narrow, has a large thickened amount. Accordingly, a thickening amount of the resist pattern largely varies depending on the direction and/or spacing variations of the resist pattern. Thus, there was a problem that when the resist pattern thickening material was used for a space pattern, on an interconnection layer of LOGIC LSI where various sizes of resist patterns are used, the burden on designing an exposure mask could not fully be alleviated.

Thus, the current situation is that there has not yet been developed a technique which can use ArF excimer laser light as the light source of an exposure device during patterning, which can sufficiently thicken ArF resist pattern or the like that cannot be thickened by using the aforementioned resist swelling material used in the RELACS technique, and which can easily form a fine space pattern of resist or an interconnection pattern at low cost. Therefore, it is desired that such technique be developed.

The present invention aims at solving the shortcomings in the prior art, and can achieve the following objects.

An object of the present invention is to provide a resist composition, which can utilize ArF excimer laser light, for example, as an exposure light during patterning; which is suitably utilized when a resist pattern thickening material is applied over a surface of a resist pattern which has been formed by exposure of light and a developing treatment so as to uniformly thicken a resist pattern, e.g., in form of space pattern, with the resist pattern thickening material regardless of the direction, spacing variations and the like of the formed resist pattern and without depending on the components of the resist pattern thickening material; which is capable of forming a fine space pattern of resist, exceeding exposure or resolution limits of light sources of available exposure devices at low cost, easily and efficiently.

Another object of the present invention is to provide a method for forming a resist pattern which, during patterning a resist pattern, can utilize ArF excimer laser light as an exposure light; which can thicken a resist pattern, e.g. in form of space pattern, regardless of the direction, spacing variations and the like of the resist pattern and without depending on the components of the resist pattern thickening material; and which is capable of forming a fine space pattern of resist, exceeding exposure or resolution limits of light sources of available exposure devices at low cost, easily and efficiently.

Yet another object of the present invention is to provide a method for manufacturing a semiconductor device in which, during patterning a resist pattern, ArF excimer laser light can be utilized as a light source; a fine space pattern of resist, exceeding exposure or resolution limits of light sources of available exposure devices, can be formed, regardless of the direction, spacing variations and the like of the resist pattern and without depending on the components of the resist pattern thickening material; and high-performance semiconductor devices having fine interconnection patterns formed by using the space pattern of resist can be efficiently mass produced, and is to provide a high-performance semiconductor which is manufactured by the method for manufacturing a semiconductor device and has fine interconnection patterns.

In view of the above-mentioned shortcomings, the inventors of the present invention have investigated vigorously, and have obtained the following findings. Specifically, when a resist pattern formed from a conventional resist composition is thickened by using a resist pattern thickening material, the resist pattern along the narrow side directions, or a region where elements of the resist pattern are sparsely located to each other, i.e. a region where space between the elements of the resist pattern is wide, has a small thickened amount due to a small amount of fogging exposure near the pattern, whereas the resist pattern along the wide side directions, or a region where the elements of the resist pattern are closely located to each other, i.e. a region where a space between the elements of the resist pattern is narrow, has a large thickened amount due to a large amount of fogging exposure. Accordingly, a thickening amount of the resist pattern largely varies depending on the direction and/or spacing variations of the resist pattern. However, when an alicyclic compound having a melting point of 90° C. to 150° C. is contained to the resist composition, the resist composition interacts with the resist pattern thickening material regardless of the amount of the exposure dose, and thus the resist pattern is efficiently and uniformly thickened, regardless of the direction and/or spacing variations of the resist pattern, components of the resist pattern thickening material, and the like.

SUMMARY OF THE INVENTION

The present invention is based on the experience and findings; and how to solve aforesaid problems is described in attached claims.

The resist composition of the present invention contains at least an alicyclic compound having a melting point of 90° C. to 150° C., and a resin.

When the resist composition is used to form a resist pattern and the formed resist pattern is thickened using a resist pattern thickening material, the resist pattern is efficiently and uniformly thickened without regardless of the direction and/or spacing variations of the resist pattern, and without depending on components of the resist pattern thickening material, and the like.

As explained above, a resist pattern formed from a conventional resist composition is thickened by using a resist pattern thickening material, the resist pattern along the narrow side directions, or a region where elements of the resist pattern are sparsely located to each other, i.e. a region where space between the elements of the resist pattern is wide, has a small thickened amount due to a small amount of fogging exposure near the pattern, whereas the resist pattern along the wide side directions, or a region where the elements of the resist pattern are closely located to each other, i.e. a region where a space between the elements of the resist pattern is narrow, has a large thickened amount due to a large amount of fogging exposure. Accordingly, a thickening amount of the resist pattern largely varies depending on the direction and/or spacing variations of the resist pattern. However, in case of the present invention, the alicyclic compound having a melting point of 90° C. to 150° C. (hereinafter, may be simply referred to as "alicyclic compound") is dispersed in the resin in the resist compound of the present invention. When the resist pattern thickening material is applied over a resist pattern formed from the resist composition of the present invention and is heated at a temperature near the melting point of the alicyclic compound, the alicyclic compound is dissolved. The dissolved alicyclic compound dissolves the resist composition on and close to the surface of the resist pattern to thereby cause an interaction, i.e., mixing, between the alicyclic compound and the resin, and the resist pattern thickening material. As the alicyclic compound induces the interaction regardless of an amount of fogging exposure near the pattern, a surface layer or mixing layer, in which the resist pattern and the resist pattern thickening material are mixed, is efficiently formed on the surface of the resist pattern as an inner layer. As a result, the resist pattern is efficiently thickened with the use of the resist pattern thickening material. The resist pattern is efficiently and uniformly thickened with the resist pattern thickening material. The resist pattern thickened in this way (hereinafter sometimes referring to as "thickened resist pattern" or "swollen resist pattern") has been uniformly thickened with the resist pattern thickening material. Thus, a space pattern of resist (hereinafter sometimes referring to as "space pattern") formed from the thickened resist pattern has a fine structure, exceeding exposure or resolution limits of light sources of available exposure devices. Thus, the resist composition of the present invention is also suitably used for forming a resist pattern such as a lines & spaces pattern, on an interconnection layer of LOGIC LSI where not only a contact hole pattern, but also various sizes of resist patterns are utilized.

The method for forming a resist pattern of the present invention includes forming, on a surface of a workpiece, a resist pattern by use of the resist composition of the present invention, and applying a resist pattern thickening material over the surface of the workpiece so as to cover the surface of the resist pattern to thereby thicken the resist pattern.

In the method for forming a resist pattern, when a resist pattern is formed using the resist composition of the present invention, the resist pattern thickening material is applied over a surface of the resist pattern, and the resist pattern is heated at a temperature near the melting point of the alicyclic compound having a melting point of 90° C. to 150° C., the alicyclic compound dispersed in the resin in the resist pattern is dissolved. The dissolved alicyclic compound dissolves the resist composition in the resist pattern, thereby the alicyclic compound and the resin interact with, i.e., are mixed with, the resist pattern thickening material. As a result, a surface layer or mixing layer where the resist pattern and the resist pattern thickening material are mixed, is formed on the surface of the resist pattern as an inner layer. The resist pattern thickened in this way has been uniformly thickened with the resist pattern thickening material. Thus, a space pattern of resist formed from the thickened resist pattern has a fine structure, exceeding exposure limits or resolution limits. Since the resist composition contains the alicyclic compound, a resist pattern formed using the resist composition is efficiently and uniformly thickened, regardless of the direction and/or spacing variations of the resist pattern, and without depending on components of the resist pattern thickening material and the like, and the thickened amount of the resist pattern has less dependency on the direction and/or spacing variations of the resist pattern, components of the resist pattern thickening material, and the like. Thus, the method for forming a resist pattern can be suitably utilized for forming a resist pattern, such as a lines & spaces pattern, on an interconnection layer of LOGIC LSI where not only a contact hole pattern, but also various sizes of resist patterns are utilized.

The method for manufacturing a semiconductor device of the present invention includes: forming, on a surface of a workpiece, a resist pattern using the resist composition of the present invention; applying a resist pattern thickening material over the surface of the workpiece so as to cover the surface of the resist pattern to thereby thicken the resist pattern; and etching the surface of the workpiece using the thickened resist pattern as a mask so as to pattern the surface of the workpiece.

In the method for forming a semiconductor device of the present invention, a resist pattern is formed from the resist composition of the invention on a surface of a workpiece serving as a subject on which interconnection patterns, etc., are formed, and then the resist pattern thickening material is applied over the resist pattern so as to cover the surface of the resist pattern. When the resist pattern is heated at a temperature near the melting point of the alicyclic compound, 90° C. to 150° C., the alicyclic compound dispersed in the resin in the resist pattern is dissolved. The dissolved alicyclic compound dissolves the resist composition in the resist pattern to thereby cause an interaction or mixing between the alicyclic compound, the resin, and the resist pattern thickening material. Thus, a surface layer or mixing layer, where the resist pattern thickening material and the resist pattern are mixed, is formed on the surface of the resist pattern as the inner layer. In this way, the resist pattern is uniformly thickened with the resist pattern thickening material. Thus, the space pattern formed by use of the thickened resist pattern has a fine structure, exceeding exposure or resolution limits. Since the resist pattern thickening material contains the alicyclic compound, the resist pattern formed from the resist composition is efficiently and uniformly thickened, regardless of the direction and/or spacing variations of the resist pattern, and without depending on components of the like of the resist pattern thickening material, and the thickened amount of the resist pattern has less dependency on the direction and/or spacing variations of the resist pattern, components of the resist pattern thickening material, and the like. Thus, thickened resist patterns such as a space pattern can be easily and precisely formed on an interconnection layer of LOGIC LSI where not only a contact hole pattern, but also various sizes of resist patterns are utilized.

Subsequently, by etching the surface of the workpiece using the thickened resist pattern as a mask, the surface of the workpiece is patterned finely and precisely with accurate dimension, thus high-quality and high performance semiconductor devices can be produced efficiently having an interconnection pattern with fine, precise, and accurate dimension.

The semiconductor device of the present invention is manufactured by the method for manufacturing a semiconductor device of the present invention. The semiconductor device has patterns, for example, interconnection patterns, with fine, precise, and accurate dimension, and is of high quality and of high performance.

BRIEF DESCRIPTION OF THE DRAWINGS

FIG. 26A is a schematic diagram for explaining an example of a resist pattern having a difference in density.

FIG. 26B is a schematic diagram for explaining an example of the state where the resist pattern having a difference in density is thickened.

FIG. 27A is a schematic diagram for explaining an example of a rectangular-shaped resist pattern.

DESCRIPTION OF THE PREFERRED EMBODIMENTS (Resist Composition)

The resist composition of the present invention contains at least an alicyclic compound having a melting point of 90° C. to 150° C., and a resin, and further contains other components suitably selected in accordance with the necessity.

Figure 27B:
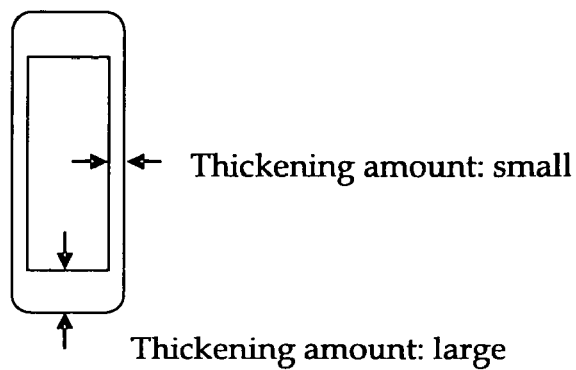
FIG. 27B is a schematic diagram for explaining an example of the state where the rectangular-shaped resist pattern is thickened.

Since the resist composition of the present invention contains the alicyclic compound having a melting point of 90° C. to 150° C., the resist composition shows an effect of thickening a resist pattern, regardless of the components of the resist pattern thickening material, which will be hereinafter described, and the thickened amount of the resist pattern has less dependency on the size, spacing variations, the direction, the components of the resist pattern thickening material, and the like. Conventionally, there was a problem that a thickening amount of a resist pattern varies depending on the size, spacing variations, and/or direction of the resist pattern. This is explained herein with reference to FIGS. 26A-27B. FIG. 26A shows a resist pattern having an uneven spacing. Namely, the resist pattern shown in FIG. 26A has a region where elements of the resist pattern are sparsely located to each other, i.e. a region where a space between the elements of the resist pattern is wide, and has a region where the elements of the resist pattern are closely located to each other, i.e. a region where a space between the elements of the resist pattern is narrow. When the resist pattern shown in FIG. 26A is thickened, the thickening amount is small in the region where the elements of the resist pattern are sparsely located to each other, due to a small amount of fogging exposure, and the thickening amount is large in the region where the elements of the resist pattern are closely located to each other, due to a large amount of fogging exposure, as shown in FIG. 26B. When a rectangular shaped resist pattern as shown in FIG. 27A is thickened, the thickening amount is larger along the direction of the wide side than the thickening amount along the direction of the narrow side, as shown in FIG. 27B.

However, when a resist pattern is formed from the resist composition of the present invention, and a resist pattern thickening material, which will be hereinafter described, is applied over the resist pattern, the portions of the applied resist pattern thickening material in a vicinity of the interface between the resist pattern thickening material and the resist pattern infiltrate into the resist pattern to cause an interaction or mixing with the material of the resist pattern. When the resist pattern is heated at a temperature near the melting point of the alicyclic compound, the alicyclic compound dispersed in the resin in the resist composition is dissolved. The dissolved alicyclic compound dissolves the resist composition in the resist pattern to thereby cause an interaction or mixing between the alicyclic compound, the resin, and the resist pattern thickening material. At this point in time, as the alicyclic compound induces the interaction, regardless of the amount of fogging exposure of the resist pattern, a surface layer (mixing layer) where the resist pattern and the resist pattern thickening material interact each other, can be effectively formed on the surface of the resist pattern as an inner layer. As a result, the resist pattern is efficiently thickened with the resist pattern thickening material, and the thickened resist pattern has been uniformly thickened with the resist pattern thickening material. Thus, a space pattern of resist formed by use of the thickened resist pattern has a fine structure, exceeding exposure or resolution limits of light sources of available exposure devices.

Alicyclic Compound

The alicyclic compound is not particularly limited and may be suitably selected in accordance with the intended use, provided that the alicyclic compound has a melting point of 90° C. to 150° C., however, preferred examples thereof include compounds having an adamantane skeleton or norbornane skeleton as an alicyclic skeleton. For these compounds, those having a proper melting point are available in the market, and they are easily available and advantageous in that changes in properties of the resist rarely occur before and after the compounds are added to the resist composition.

Since a slight amount the alicyclic compound is used, the influence on the properties of the resist composition is extremely small, even when the resist composition contains the alicyclic compound.

An adamantane compound having an alicyclic skeleton of adamantane is not particularly limited and may be suitably selected in accordance with the intended use, however, preferred examples thereof include compounds represented by the following Structural Formulas (1) to (5). For the respective melting points of these compounds, compounds represented by the following Structural Formula (1) typically have a melting point of around 115° C.; compounds represented by the following Structural Formula (2) typically have a melting point of around 135° C.; compounds represented by the following Structural Formula (3) typically have a melting point of around 148° C.; compounds represented by the following Structural Formula (4) typically have a melting point of around 115° C.; and compounds represented by the following Structural Formula (5) typically have a melting point of around 106° C.

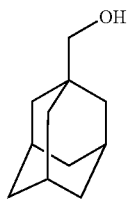

Structural Formula (1)

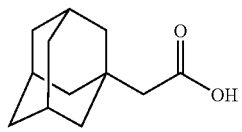

Structural Formula (2)

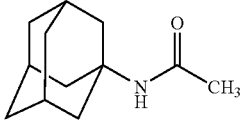

Structural Formula (3)

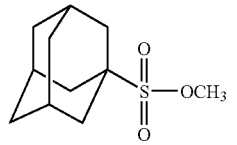

Structural Formula (4)

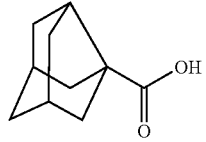

Stuctural Formula (5)

A norbornane compound having an alicyclic skeleton of norbornane is not particularly limited and may be suitably selected in accordance with the intended use, however, preferred examples thereof include compounds represented by the following Structural Formulas (6) to (8). For the respective melting points of these compounds, compounds represented by the following Structural Formula (6) typically have a melting point of around 95° C.; compounds represented by the following Structural Formula (7) typically have a melting point of around 112° C.; and compounds represented by the following Structural Formula (8) typically have a melting point of around 125° C. (exo) and around 150° C. (endo).

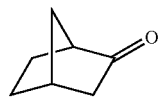

Structural Formula (6)

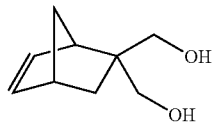

Structural Formula (7)

-continued

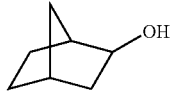

Structural Formula (8)

The aforesaid adamantane compounds and norbornane compounds may be used alone or in combination with two or more.

The content of the alicyclic compound in the resist composition is not particularly limited, may be suitably selected in accordance with the intended use, however, the content of the alicyclic compound to the mass of the resin is preferably 0.01% by mass to 5% by mass, and more preferably 0.05% by mass to 2% by mass.

When the content of the alicyclic compound to the mass of the resin is less than 0.01% by mass, the reactivity with the resist pattern thickening material may be degraded, and when the content of the alicyclic compound to the mass of the resin is more than 5% by mass, the properties of the resist may be degraded due to precipitation of the alicyclic compound.

The alicyclic compound may be added at the time of preparation of the resist composition for use or may be added in an appropriate amount to a commercially available resist composition.

The method to verify the presence of the alicyclic compound in the resist composition is not particularly limited and may be suitably selected in accordance with the intended use. For example, the presence of the alicyclic compound can be properly verified by infrared spectroscopy (IR) and the like.

The resist composition of the present invention is not particularly limited and may be suitably selected in accordance with the intended use, provided that the resist composition contains the alicyclic compound having a melting point of 90° C. to 150° C. However, it is preferable that the resist composition be exposed with an exposure light such as a g-ray (wavelength: 436 nm), an i-ray (wavelength: 365 nm), a KrF excimer laser light (wavelength: 248 nm), an ArF excimer laser light (wavelength: 193 nm), an $F_2$ excimer laser light (wavelength: 157 nm), EUV laser light (soft x-ray region of a wavelength of 5 nm to 15 nm), an electron beam, or an x-ray.

Resin

The resin is not particularly limited, may be suitably selected from among resist materials known in the art in accordance with the intended use, provided that the resin can be appropriately patterned by means of a light used for the exposure. Examples thereof include g-ray resists, i-ray resists, KrF resists, ArF resists, $F_2$ resists, and electron beam resists. These are either chemically amplified resists or non-chemically amplified resists. Among these examples, a KrF resist, an ArF resist and a resist containing an acrylic resin are preferably used. From the perspective of fine patterning and improvements of throughput, an ArF resist which is desired to extend the exposure limit thereof, and the resist containing an acrylic resin are more preferable.

The ArF resist is not particularly limited, may be suitably selected in accordance with the intended use, however, preferred examples thereof include alicyclic resists.

Examples of the alicyclic resist include an acrylic resist having an alicyclic functional group at a side chain thereof, a cycloolefin-maleic acid anhydride (COMA) resist, a cycloolefin resist, a hybrid resist, e.g. alicyclic acryl-COMA copolymer resist. These resins may be modified with fluorine.

The alicyclic functional group is not particularly limited, may be suitably selected in accordance with the intended use, however, preferred examples thereof include adamantyl functional groups, norbornene functional groups. Preferred examples of the cycloolefin resist include cycloolefin resists containing adamantane, norbornene, tricyclononane or the like in its main chain.

A forming method, size, thickness or the like of the resist pattern may be suitably selected in accordance with the intended use. The thickness of the resist pattern is appropriately determined in accordance with a surface of a workpiece serving as a working subject, conditions of etching, or the like, but the thickness thereof is generally 0.1 µm to 500 µm.

The thickening of the resist pattern using the resist pattern thickening material will be hereinafter explained with reference to figures.

Figure 1A:
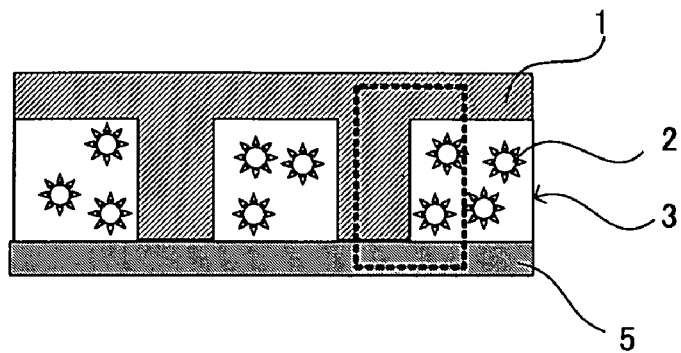
FIG. 1A is a schematic diagram for explaining one example of the mechanism of thickening a resist pattern containing the resist composition of the present invention to be thickened by using a resist pattern thickening material, and showing the state where the resist pattern thickening material is applied over the surface of the resist pattern.
Figure 1B:
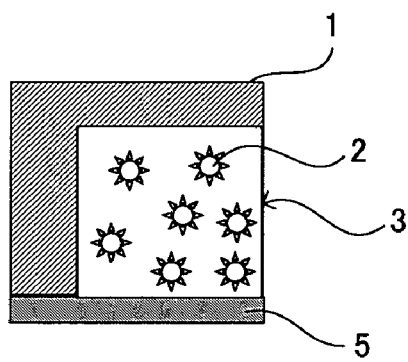
FIG. 1B is a schematic diagram for explaining one example of the mechanism of thickening a resist pattern containing the resist composition of the present invention to be thickened by using a resist pattern thickening material, and showing the state where the alicyclic compound is dispersed in the resist composition.
Figure 1C:
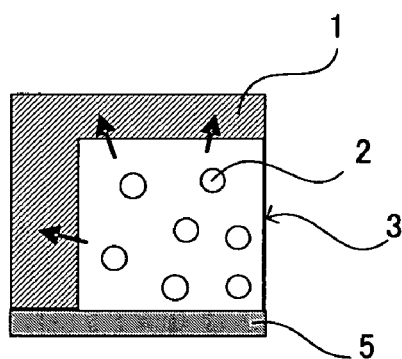
FIG. 1C is a schematic diagram for explaining one example of the mechanism of thickening a resist pattern containing the resist composition of the present invention to be thickened by using a resist pattern thickening material, and showing the state where the alicyclic compound in the resist composition is dissolved.
Figure 2A:
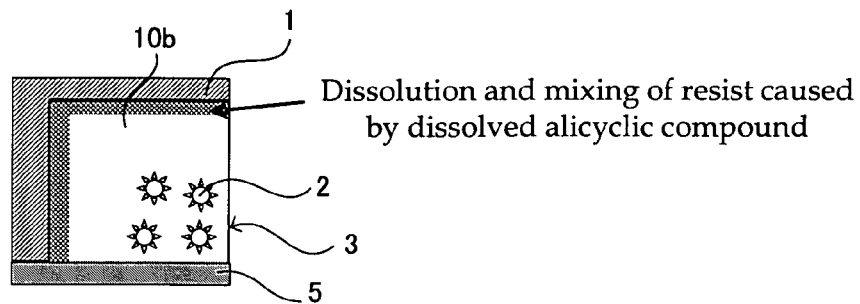
FIG. 2A is a schematic diagram for explaining one example of the mechanism of thickening a resist pattern containing the resist composition of the present invention to be thickened by using a resist pattern thickening material, and showing the state where the dissolved alicyclic compound dissolves the resist pattern to cause a mixing of the resist pattern and the resist pattern thickening material.
Figure 2B:
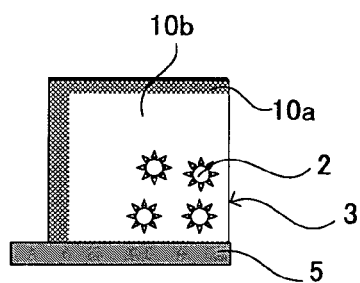
FIG. 2B is a schematic diagram for explaining one example of the mechanism of thickening a resist pattern containing the resist composition of the present invention to be thickened by using a resist pattern thickening material, and showing the state where the resist pattern thickening material infiltrates into the surface of the resist pattern.

As shown in FIG. 1A, after a resist pattern 3 is formed from the resist composition containing an alicyclic compound 2 having a melting point of 90° C. to 150° C. (sometimes referring to as "alicyclic compound" simply) of the present invention on a surface of a workpiece (base) 5, a resist pattern thickening material 1 is applied (coated) over the surface of the resist pattern 3. The resist film is pre-baked (heated and dried such that a coated film is formed. Here, the alicyclic compound 2 dispersed in the resist pattern 3 as shown in FIG. 1B is dissolved by heating at a temperature near the melting point of the alicyclic compound 2, as shown in FIG. 1C. Then, the portions of the dissolved alicyclic compound 2 dissolve the resist pattern 3. Mixing or infiltrating of the resist pattern thickening material 1 into the resist pattern 3 occurs at the interface between the resist pattern 3 and the resist pattern thickening material 1. Then, as shown in FIG. 2B, a surface layer or mixing layer 10a is formed as the result of reaction of the mixed or infiltrated portions at the interface of an inner layer resist pattern 10b (the resist pattern 3) and the resist pattern thickening material 1. At this time, since the alicyclic compound 2 is contained in the resist pattern 3 (see FIG. 1A), the inner layer resist pattern 10b (the resist pattern 3) can be efficiently and uniformly thickened without depending on the exposure conditions and/or thickening conditions such as spacing variations of the inner layer resist pattern 10b (the resist pattern 3). In FIGS. 2A and 2B, the portions of the alicyclic compound 2 which are residing inside the resist pattern 3 and are located at the regions being away from the surface of the resist pattern 3 are dissolved once, but thereafter restore to the pre-dissolution state, because such portions are not directly subjected to the reaction.

Figure 3:
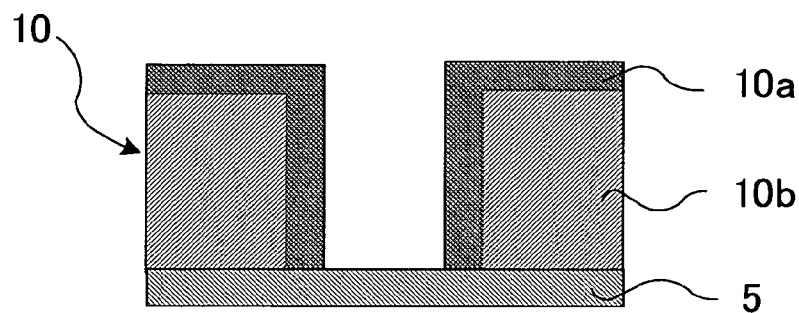
FIG. 3 is a schematic diagram for explaining one example of the mechanism of thickening a resist pattern containing the resist composition of the present invention to be thickened by using a resist pattern thickening material, and showing the state where the resist pattern is thickened with the resist pattern thickening material, thereby forming a resist pattern.

Thereafter, as shown in FIG. 3, by subjecting the resist pattern 3 to a developing treatment, the portions with no interaction or mixing with the resist pattern 3 or portions with less interaction or mixing with the resist pattern 3, i.e., the portions having high water-solubility, in the resist pattern thickening material 1 coated on the resist pattern 3, are dissolved and removed, and therefore a thickened resist pattern 10, which has been uniformly thickened, is developed or formed.

The resist pattern 3 can be developed by use of water or an alkaline developer.

The thickened resist pattern 10 has, on the surface of the inner layer resist pattern 10b (the resist pattern 3), the surface layer 10a (mixing layer) which has been formed as a result of mixing or infiltrating of the resist pattern thickening material 1. Since the thickened resist pattern 10 is thicker than the resist pattern 3 by an amount corresponding to the thickness of the surface layer 10a, the size of space pattern formed using the thickened resist pattern 10 i.e. the distance between adjacent elements of the thickened resist pattern 10 or opening diameter of the hole pattern formed from the thickened resist pattern 10, is smaller than that formed from the resist pattern 3 prior to thickening. Thus, the space pattern of resist can be formed finely, exceeding exposure or resolution limits of a light source of the exposure device used in forming the resist pattern 3. Namely, when a resist pattern is patterned by means of ArF excimer laser light as exposure light and thickened with the resist pattern thickening material, the space pattern formed from the thickened resist pattern can represent such fine conditions as those patterned by use of an electron beam. The space pattern formed from the thickened resist pattern 10 is finer and more precise than the space pattern formed from the resist pattern 3.

Since the resist composition of the present invention contains the alicyclic compound having a melting point of 90° C. to 150° C., the resist composition is suitably used in the process steps in which the resist film is subjected to exposure and developing treatments to form a resist pattern, and a resist pattern thickening material is applied over a surface of the resist pattern to thicken the resist pattern, and the resist composition allows a resist pattern to be thickened uniformly with the resist pattern thickening material, regardless of the direction, spacing variations, or the like of the formed resist pattern and without depending on the components of the resist pattern thickening material as well as enables efficiently forming a fine space pattern of resist in simple procedures at low cost, exceeding exposure or resolution limits of a light source of an exposure device for use. Further, the resist composition of the present invention can be particularly suitably utilized for the method for forming a resist pattern of the present invention, a method for manufacturing a semiconductor device of the present invention, and the like.

(Method for Forming Resist Pattern)

The method for forming a resist pattern of the present invention includes at least forming a resist pattern on a surface of a workpiece to be processed by using a resist composition; and applying a resist pattern thickening material on the surface of the workpiece so as to cover the surface of the resist pattern, and further includes other treatments suitably selected in accordance with the necessity.

The details of the resist composition are as described in the section of the resist composition of the present invention.

The resist pattern can be formed according to a method known in the art.

The resist pattern can be formed on a surface of a workpiece (base). The surface of the workpiece (base) is not particularly limited, and may be suitably selected in accordance with the intended use. However, when the resist pattern is formed in a semiconductor device, the surface of the workpiece (base) is preferably, for example, a surface of a semiconductor substrate. Specific examples thereof include surfaces of substrates such as silicon wafers, and various types of oxide films.

Resist Pattern Thickening Material

The resist pattern thickening material is not particularly limited, may be suitably selected from among those known in the art in accordance with the intended use, and may be a commercially available one or may be suitably synthesized. However, the resist pattern thickening material preferably contains at least a water-soluble or alkali-soluble resin or preferably contains a cross-linker or a compound represented by General Formula (1) and further contains a surfactant, an organic solvent, and other components, suitably selected in accordance with the necessity.

The resist pattern thickening material is preferably water-soluble or alkali-soluble.

The water-solubility is not particularly limited, may be suitably selected in accordance with the intended use, however, the water-solubility of which 0.1 g or more of the resist pattern thickening material can be dissolved relative to 100 g of 25° C. water, is preferable.

The alkali-solubility is not particularly limited, may be suitably selected in accordance with the intended use, however, the alkali-solubility of which 0.1 g or more of the resist pattern thickening material can be dissolved relative to 100 g of 2.38% by mass of 25° C. tetramethylammonium hydroxide (TMAH) aqueous solution, is preferable.

The resist pattern thickening material may be an aqueous solution, a colloidal solution, or an emulsion solution, however, an aqueous solution is preferable.

Water-Soluble or Alkali-Soluble Resin

The water-soluble or alkali-soluble resin is preferably the one having two or more polar groups from the perspective of exhibiting excellent water-solubility or alkali-solubility.

The polar groups are not particularly limited and may be suitably selected in accordance with the intended use. Preferred examples thereof include hydroxyl groups, amino groups, sulfonyl groups, carbonyl groups, carboxyl groups, and derivative groups thereof. Each of these groups may be contained in the water-soluble or alkali-soluble resin alone or in combination with two or more.

When the water-soluble or alkali-soluble resin is a water-soluble resin, a water-soluble resin capable of exhibiting water-solubility of which 0.1 g or more of the resin is dissolved relative to 100 g of 25° C. water, is preferable for the water-soluble resin.

Examples of the water-soluble resin include polyvinyl alcohols, polyvinyl acetals, polyvinyl acetates, polyacrylic acids, polyvinyl pyrolidones, polyethylene imines, polyethylene oxides, styrene-maleic acid copolymers, polyvinyl amines, polyallyl amines, oxazoline group-containing water-soluble resins, water-soluble melamine resins, water-soluble urea resins, alkyd resins, sulfone amide resins, celluloses, and tannins.

When the water-soluble or alkali-soluble resin is an alkali-soluble resin, an alkali-soluble resin capable of exhibiting alkali-solubility of which 0.1 g or more of the resin is dissolved relative to 100 g of 2.38% by mass of 25° C. tetramethylammonium hydroxide (TMAH) aqueous solution, is preferable for the alkali-soluble resin.

Examples of the alkali-soluble resin include novolac resins, vinylphenol resins, polyacrylic resins, poly-p-hydroxyphenyl acrylates, poly-p-hydroxyphenyl methacrylates, and copolymers thereof.

Each of these water-soluble or alkali-soluble resins may be used alone or in combination with two or more. Of these, polyvinyl alcohols, polyvinyl acetals, polyvinyl acetates, and tannins are preferably used.

The content of the water-soluble or alkali-soluble resin in the resist pattern thickening material can be suitably determined in accordance with the components and contents of the cross-linker or the compound represented by General Formula (1), and the surfactant, and the like, which will be hereinafter described in detail.

Cross-Linker

The cross-linker is not particularly limited and may be suitably selected in accordance with the intended use, however, preferred examples thereof include melamine derivatives, urea derivatives, and uril derivatives. Each of these cross-linkers may be used alone or in combination with two or more.

The content of the cross-linker in the resist pattern thickening material can be suitably determined in accordance with the components, the content and the like of the water-soluble or alkali-soluble resin, and the like.

Compound Represented by General Formula (1)

The compound represented by General Formula (1) is not particularly limited, may be suitably selected in accordance with the intended use, provided that the compound has an aromatic ring in a part of the structure thereof and is represented by General Formula (1). A compound having the aromatic ring enables imparting high etch resistance to the resist pattern thickening material.

When the cross-linker is used, a resist pattern is thickened by utilizing a cross-linking reaction induced by residual acid, however, when a compound represented by the following General Formula (1) is used instead of the cross-linker, the reaction can be easily controlled, because the compound causes no cross-linking reaction, and it is advantageous in that the resist pattern can be easily thickened without depending on the size of the resist pattern.

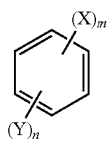

General Formula (1)

In the General Formula (1), X represents a functional group represented by the following General Formula (2); Y represents at least one selected from the group consisting of hydroxyl groups, amino groups, amino groups substituted with alkyl groups, alkoxy groups, alkoxy-carbonyl groups, and alkyl groups; and the number of substitutions is an integer of 0 to 3.

"m" is an integer of 1 or more, and "n" is an integer of 0 or more. It is preferred that "m" be 1 in that the occurrence of cross-linking reactions can be prevented to thereby control the reaction with ease.

General Formula (2)

In the General Formula (2), $R^1$ and $R^2$ may be the same to each other or different from each other, and respectively represent hydrogen or a substituent group. Z represents at least one selected from the group consisting of hydroxyl groups, amino groups, amino groups substituted with alkyl groups, and alkoxy groups; and the number of substitutions is an integer of 0 to 3.

In the General Formula (2), it is preferable that $R^1$ and $R^2$ be hydrogen. When the $R^1$ and $R^2$ are respectively hydrogen, in most cases, it is advantageous in water-solubility.

In the General Formula (2), when $R^1$ and $R^2$ respectively the substituent group, the substituent group is not particularly limited, may be suitably selected in accordance with the intended use, and examples thereof include ketone (alkyl carbonyl) groups, alkoxy carbonyl groups, and alkyl groups.

Specific preferred examples of the compound represented by the General Formula (1) include compounds each having a benzyl alcohol structure, compounds each having a benzylamine structure.

The compound having a benzyl alcohol structure is not particularly limited and may be suitably selected in accordance with the intended use, however, benzyl alcohols and derivatives thereof are preferable. Specific examples are benzyl alcohol, 2-hydroxybenzyl alcohol (salicyl alcohol), 4-hydroxybenzyl alcohol, 2-aminobenzyl alcohol, 4-aminobenzyl alcohol, 2,4-hydroxybenzyl alcohol, 1,4-benzenedimethanol, 1,3-benzenedimethanol, 1-phenyl-1,2-ethanediol, and 4-methoxymethylphenol.

The compound having a benzylamine structure is not particularly limited and may be suitably selected in accordance with the intended use. However, benzylamines and derivatives thereof are preferable. Specific examples are benzylamine and 2-methoxybenzylamine.

Each of these compounds may be used alone or in combination with two or more. Of these, 2-hydroxybenzyl alcohol, 4-aminobenzyl alcohol, and the like are preferable from the perspective that these compounds have high water solubility, and thus can be dissolved in large amount.

The content of the compound represented by the General Formula (1) in the resist pattern thickening material is not particularly limited and may be suitably selected in accordance with the intended use. For instance, the content of the compound is preferably 0.01 parts by mass to 50 parts by mass to the total amount of the resist pattern thickening material, and more preferably a 0.1 parts by mass to 10 parts by mass.

When the content of the compound represented by the General Formula (1) is less than 0.01 parts by mass, desired reaction amount may not be obtained. The content exceeding 50 parts by mass is not preferable because it is highly possible that the compound is precipitated during applying the resist pattern thickening material, and a defect is caused on the pattern.

Surfactant

When there are needs, for example, a need to improve the conformability between a resist pattern thickening material and a resist pattern, a need for a larger amount of thickening of the resist pattern to be thickened, a need to improve uniformity of the thickening effect at the interface between a resist pattern thickening material and a resist pattern, and a need for anti-forming property, the addition of the surfactant can realize these needs.

The surfactant is not particularly limited and may be suitably selected in accordance with the intended use. Examples thereof include nonionic surfactants, cationic surfactants, anionic surfactants, and amphoteric surfactants. Each of these surfactants may be used alone or in combination with two or more. Of these, nonionic surfactants are preferred from the perspective that they do not contain metallic ions such as sodium ion, potassium ion.

Preferred examples of the nonionic surfactants are ones selected from alkoxylate surfactants, fatty acid ester surfactants, amide surfactants, alcohol surfactants, and ethylenediamine surfactants. Specific examples thereof include polyoxyethylene-polyoxypropylene condensation compounds, polyoxy alkylene alkyl ether compounds, polyoxyethylene alkyl ether compounds, polyoxyethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid ester compounds, amide compounds, natural alcohol compounds, ethylenediamine compounds, and secondary alcohol ethoxylate compounds.

The cationic surfactants are not particularly limited and may be suitably selected in accordance with the intended use. Examples thereof include alkyl cationic surfactants, amide quaternary cationic surfactants, and ester quaternary cationic surfactants.

The amphoteric surfactants are not particularly limited and may be suitably selected in accordance with the intended use. Examples thereof include amine oxide surfactants, and betaine surfactants.

The content of the surfactant in the resist pattern thickening material is not particularly limited and may be suitably selected in accordance with the components, contents, etc. of the water-soluble or alkali-soluble resin, the compound represented by the General Formula (1). The content of the surfactant is preferably, for example, 0.01 parts by mass or more relative to 100 parts by mass of the resist pattern thickening material, and more preferably 0.05 parts by mass to 2 parts by mass, and still more preferably 0.08 parts by mass to 0.5 parts by mass from the perspective of excellence in the reaction amount and in-phase uniformity.

When the content of the surfactant is less than 0.01 parts by mass, there is an effect of improvement in coating property, however, in most cases, the reaction amount of the resist pattern thickening material hardly differs from the reaction amount in the case where no surfactant is added.

Organic Solvent

The organic solvent is not particularly limited and may be suitably selected in accordance with the intended use. Examples thereof include alcohol-based organic solvents, chain ester-based organic solvents, cyclic ester-based organic solvents, ketone-based organic solvents, chain ether-based organic solvents, and cyclic ether-based organic solvents.

When the resist pattern thickening material comprises the organic solvent, it is advantageous in that the resin, the compound represented by the General Formula (1), etc. may be improved in terms of the solubility in the resist pattern thickening material.

The organic solvent can be mixed with water for use. Preferred examples of the water include pure water (deionized water).

Examples of the alcohol-based organic solvents are methanols, ethanols, propyl alcohols, isopropyl alcohols, and butyl alcohols.

Examples of the chain ester-based organic solvents include ethyl lactates, and propylene glycol methyl ether acetate (PGMEA).

Examples of the cyclic ester-based organic solvents include lactones such as γ-butyrolactone.

Examples of the ketone-based organic solvents include acetone, cyclohexanone, and heptanone.

Examples of the chain ether-based organic solvents include ethyleneglycol dimethylether.

Examples of the cyclic ether-based organic solvents include tetrahydrofuran, and dioxane.

Each of these organic solvents may be used alone or in combination with two or more. Of these, solvents having a boiling point of around 80° C. to 200° C. are preferable from the perspective of performance to thicken the resist pattern precisely.

The content of the organic solvent in the resist pattern thickening material can be suitably determined in accordance with the components, content, etc. of the water-soluble or alkali-soluble resin, the cross-linker or the compound represented by the General Formula (1), surfactant, and the like.

Other Components

The other components are not particularly limited as long as they do not interfere with the effects of the present invention, and may be suitably selected in accordance with the intended use. Examples thereof are various types of known additives such as thermal acid generating agents, quenchers such as amine type, amide type, and the like.

The content of the other components in the resist pattern thickening material can be suitably determined in accordance with the components, content etc. of the water-soluble or alkali-soluble resin, the cross-linker or the compound represented by the General Formula (1), surfactant, and the like.

The method of applying the resist pattern thickening material is not particularly limited and may be suitably selected from among known coating methods in accordance with the intended use. Preferred examples include a spin coating method. When a spin coating method is used, the conditions are as follows, for example, the rotation speed is typically around 100 rpm to 10,000 rpm, and preferably 800 rpm to 5,000 rpm, and the rotation time is around 1 second to 10 minutes, and is preferably 1 second to 90 seconds.

The coated thickness at the time of coating is usually around 10 nm to 1,000 nm (100 angstroms to 10,000 angstroms), and preferably 100 nm to 500 nm (1,000 angstroms to 5,000 angstroms).

Note that, at the time of coating, the surfactant may be applied before and separately from applying the resist pattern thickening material, without being contained in the resist pattern thickening material.

It is preferable to pre-bake (heat and dry) the applied resist pattern thickening material during or after applying the resist pattern thickening material. By pre-baking (heating and drying) the applied resist pattern thickening material, the alicyclic compound can be easily fused, and the resist pattern can be fused by the fused alicyclic compound, and thus the resist pattern can be efficiently thickened.

The heating temperature i.e. temperature of the prebaking (heating and drying) of the applied resist pattern thickening material may be suitably selected in accordance with the intended use as long as the prebaking does not cause softening of the resist pattern, however, the temperature is preferably near the melting point of the alicyclic compound (90° C. to 150° C.), and more preferably the melting point or more.

When the heating temperature departs from the melting point of the alicyclic compound, the alicyclic compound may not be dissolved, and the thickening effect of the resist pattern may not be obtained.

The applied resist pattern thickening material may be pre-baked once or two or more times. When the applied resist pattern thickening material is pre-baked two or more times, the temperature of prebaking at each time may be constant or may be different. The prebaking time is preferably around 10 seconds to 5 minutes, and more preferably 40 seconds to 100 seconds.

In accordance with the necessity, it is preferable to bake the applied resist pattern thickening material after the prebaking (heating and drying) to accelerate the reaction of the applied resist pattern thickening material from the perspective that the mixing or infiltrating at the interface between the resist pattern and the resist pattern thickening material can be made to proceed efficiently.

The conditions, the method and the like of the baking for reaction are not particularly limited and may be suitably selected in accordance with the intended use. However, usually, a higher temperature than that of the prebaking (heating and drying) is used. The conditions of the baking are, for example, that the temperature is typically around 70° C. to 150° C., and preferably 90° C. to 130° C., and the baking time is typically 10 seconds to 5 minutes, and more preferably 40 seconds to 100 seconds.

Further, it is preferable to develop the applied resist pattern thickening material after the applying or after the applying and baking. In this case, when the applied resist pattern thickening material is developed after the heating, it is preferable in that the portions with no interaction or mixing with the resist pattern, or the portions with less interaction or mixing with the resist pattern, i.e., the portions having high water-solubility, in the applied resist pattern thickening material, are dissolved and removed to thereby develop (obtain) a thickened resist pattern.

The applied resist pattern thickening material may be developed using water or may be developed using an alkaline solution or an acidic solution. Developing with water is preferable in that the developing treatment can be efficiently carried out at low cost.

When the resist pattern thickening material is applied over a surface of the resist pattern to cause an interaction (mixing) between the resist pattern thickening material and the resist pattern, a layer or a mixing layer where the resist pattern thickening material interacts with the resist pattern, is formed on the surface of the resist pattern. As the result, the resist pattern is thicker than the resist pattern to be thickened i.e. the resist pattern before thickening, by an amount corresponding to the thickness of the mixing layer, and a thickened resist pattern is formed.

When the compound represented by the General Formula (1) is contained in the resist pattern thickening material, it makes it possible to obtain the effect of efficiently and uniformly thickening a resist pattern, regardless of the components, size, or the like of the resist pattern, and the thickened amount has less dependency on the material and size of the resist pattern.

The diameter and the width of the space pattern of resist formed from the thus thickened resist pattern are smaller than those of the space pattern of resist that has been formed from the resist pattern before thickening. As the result, a fine space pattern of resist can be formed, exceeding exposure or resolution limits of a light source of the exposure device used in patterning of the resist pattern, namely, with lower values than the threshold limits of aperture diameter or patterning intervals allowing patterning with the wavelength of light used for the light source. In other words, when the resist pattern is patterned by means of ArF excimer laser light as exposure light and thickened with the resist pattern thickening material, the space pattern formed from the thickened resist pattern can represent such fine conditions as those patterned by use of an electron beam.

The thickened amount of the resist pattern can be controlled within a desired range by appropriately controlling the viscosity, coating thickness of the resist pattern thickening material, temperature of baking, baking time, or the like.

The method for forming a resist pattern of the present invention will be described hereinafter with reference to the figures.

Figure 4:
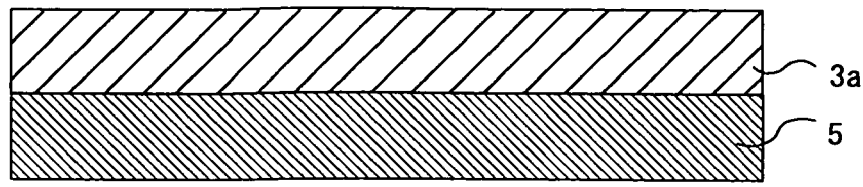
FIG. 4 is a schematic diagram for explaining an example of a method for forming a resist pattern of the present invention, and showing the state where a resist film is formed.
Figure 5:
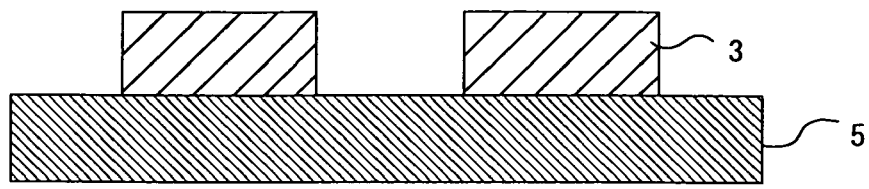
FIG. 5 is a schematic diagram for explaining an example of a method for forming a resist pattern of the present invention, and showing the state where the resist film is subjected to a patterning, thereby forming a resist pattern.
Figure 6:
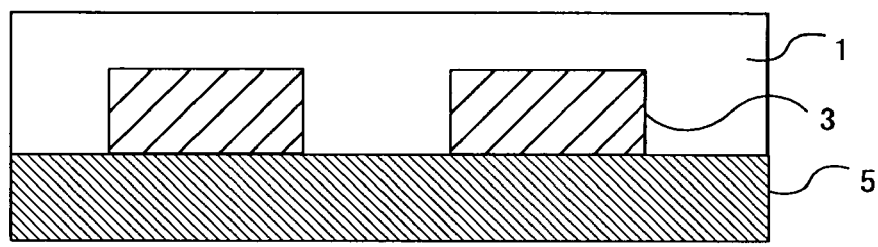
FIG. 6 is a schematic diagram for explaining an example of a method for forming a resist pattern of the present invention, and showing the state where the resist pattern thickening material is applied over the surface of the resist pattern.
Figure 7:
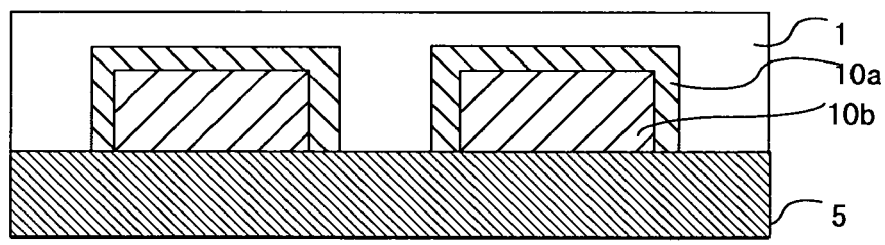
FIG. 7 is a schematic diagram for explaining an example of a method for forming a resist pattern of the present invention, and showing the state where a mixing occurred at the vicinity of the surface of the resist pattern and the resist pattern thickening material infiltrates into the resist pattern.
Figure 8:
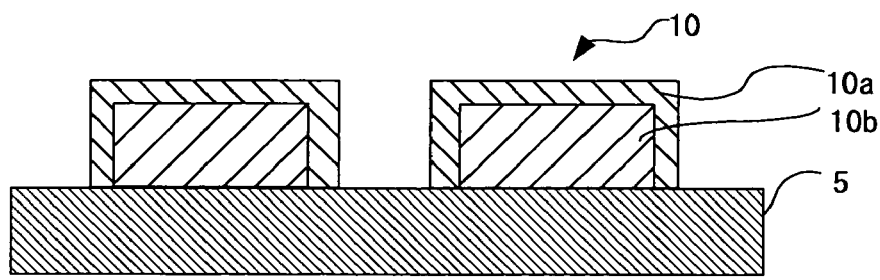
FIG. 8 is a schematic diagram for explaining an example of a method for forming a resist pattern of the present invention, and showing the state where the resist pattern thickening material is developed.

As shown in FIG. 4, a resist composition 3a of the present invention is applied over a surface of a workpiece (base) 5 to be processed. Then, as shown in FIG. 5, the resist film is patterned to form the resist pattern 3. Then, a resist pattern thickening material 1 is applied over the surface of the resist pattern 3, as shown in FIG. 6, and the resist film is pre-baked (heated and dried) to form a coated film. Then, mixing or infiltrating of the resist pattern thickening material 1 into the resist pattern 3 takes place at the interface between the resist pattern 3 and the resist pattern thickening material 1. As shown in FIG. 7, mixed or infiltrated portions at the interface between the resist pattern 3 and the resist pattern thickening material 1 further interact or react to each other. Thereafter, as shown in FIG. 8, by subjecting the resist film to a developing treatment, the portions with no reaction or less interaction or mixing with the resist pattern 3, i.e. the portions having high water-solubility, in the applied resist pattern thickening material 1, are dissolved and removed such that the thickened resist pattern 10 composed of an inner layer resist pattern 10b (the resist pattern 3) and a surface layer 10a thereon, can be developed or formed.

The thickened resist pattern 10 is formed as a result of thickening of the resist pattern 3 by use of the resist pattern thickening material 1, and has, on the surface of the inner layer resist pattern 10b (the resist pattern 3), the surface layer 10a formed as a result of reaction of resist pattern thickening material 1. Since the resist composition 3a contains the alicyclic compound having a melting point of 90° C. to 150° C., the thickened resist pattern 10 can be thickened efficiently and uniformly without depending on the direction, spacing variations, etc. of the inner layer resist pattern 10b (the resist pattern 3) and the components of the resist pattern thickening material 1. Moreover, when the resist pattern thickening material 1 contains the water-soluble or alkali-soluble resin and the compound represented by the General Formula (1), the thickened resist pattern 10 can be formed efficiently and uniformly, regardless of the size, and components of the material of the resist pattern 3. The thickened resist pattern 10 is thicker than the resist pattern 3 (the inner layer resist pattern 10b) by an amount corresponding to the thickness of the surface layer 10a. Thus, the width of the space pattern i.e. the distance between adjacent elements of the resist pattern, formed from the thickened resist pattern 10 is narrower than that of the space pattern formed from the resist pattern 3, and the space pattern formed from the thickened resist pattern 10 is fine.

When the surface layer 10a of the thickened resist pattern 10 is formed from the resist pattern thickening material 1, and the resist pattern thickening material 1 contains the compound represented by the General Formula (1) having an aromatic ring, it is possible to form the thickened resist pattern 10 having the surface layer (mixing layer) 10a, on the surface thereof, which excels in etch resistance, even when the resist pattern 3 (the inner layer resist pattern 10b) is made of a material having low etch resistance.

The resist pattern which is formed by the method for forming a resist pattern of the present invention (hereinafter sometimes referring to as "thickened resist pattern") has, on the surface of the resist pattern, a surface layer which is formed as a result of an interaction or mixing between the resist pattern and the resist pattern thickening material. When the resist pattern thickening material contains the compound represented by the General Formula (1) having an aromatic ring, it is possible to efficiently form a thickened resist pattern having, on the surface thereof, a surface layer (mixing layer) which excels in etch resistance, even when the resist pattern is made of a material which has low etch resistance. Further, since the thickened resist pattern formed by the method for forming a resist pattern of the present invention is thicker than the resist pattern before thickening by an amount corresponding to the thickness of the surface layer or mixing layer, the size such as diameter and width of the space pattern formed from thickened resist pattern 10 is smaller than that of a space pattern formed from the resist pattern before thickening. Thus, by using the method for forming a resist pattern of the present invention, a fine space pattern of resist can be formed efficiently.

The thickened resist pattern preferably has high etch resistance. It is preferable that the etching rate (nm/min) of the thickened resist pattern is equivalent to or less than that of the resist pattern. Specifically, the ratio of the etching rate (nm/min) of the resist pattern to the etching rate (nm/min) of the surface layer or mixing layer determined under the same condition, i.e. resist pattern/surface layer or mixing layer, determined under the same condition is preferably 1.1 or more, more preferably 1.2 or more, and particularly preferably 1.3 or more.

The etching rate (nm/min) can be determined, for example, by measuring the reduced amount of a sample film using a conventional etching system after etching for a predetermined time, and calculating the reduction per unit time.

The surface layer or mixing layer can be suitably formed by using the resist pattern thickening material of the present invention.

Whether or not the surface layer or mixing layer contains the cyclic structure can be checked by, for example, analyzing the IR absorption spectrum of the surface layer or mixing layer.

The method for forming a resist pattern of the present invention is suitable for forming a variety of space patterns of resist, for example, lines & spaces patterns, hole patterns (e.g. for contact hole), trench (groove) patterns, and the like. The thickened resist pattern formed by the method for forming a resist pattern can be used as a mask pattern, reticle pattern and the like, can be suitably applied for manufacturing functional parts such as metal plugs, various interconnections, recording heads, LCDs (liquid crystal displays), PDPs (plasma display panels), SAW filters (surface acoustic wave filters); optical parts used in connecting optical wiring; fine parts such as microactuators; semiconductor devices; and the like, and can be suitably employed in the method for manufacturing a semiconductor device of the present invention, which will be described hereinafter.

(Method for Manufacturing Semiconductor Device)

The method for manufacturing a semiconductor device of the present invention includes a resist pattern forming step and a patterning step, and further include any other steps suitably selected in accordance with the necessity.

The resist pattern forming step is a step for forming a resist pattern on a surface of a workpiece to be processed using the resist composition of the present invention, and applying a resist pattern thickening material over the surface of the workpiece so as to cover the surface of the resist pattern to thereby thicken the resist pattern. A thickened resist pattern can be formed on the surface of the workpiece to be processed by the resist pattern forming step.

The details of the resist pattern forming step are the same as those described in the method for forming a resist pattern of the present invention.

Note that examples of the surface of the workpiece to be processed include surface layers of various members in semiconductor devices. Preferred examples are substrates such as silicon wafers, surface layers thereof, and various types of oxide films. The resist pattern to be thickened is as described above. The method of coating is also as described above. Further, after a resist pattern thickening material is applied, it is preferable to pre-bake (heat and dry), bake the applied resist pattern thickening material.

The heating temperature is not particularly limited, and may be suitably selected in accordance with the intended use as long as the heating does not soften the resist pattern. However, the heating temperature is preferably near the melting point of the alicyclic compound (90° C. to 150° C.), and more preferably the melting point or more.

When the heating temperature departs from the melting point of the alicyclic compound, the alicyclic compound may not be dissolved, and the thickening effect of the resist pattern may not be obtained.

The applied resist pattern thickening material may be pre-baked once or two or more times. When the applied resist pattern thickening material is pre-baked two or more times, the temperature of prebaking at each time may be constant or may be different. The time is preferably around 10 seconds to 5 minutes, and 40 seconds to 100 seconds is more preferable.

The patterning step is a step for patterning the surface of the workpiece by etching the surface of the workpiece using the thickened resist pattern formed by the resist pattern forming step as a mask or the like (as a mask pattern or the like).

The method of etching is not particularly limited and may be suitably selected from among known methods in accordance with the intended use. For example, dry etching is a suitable example. The etching conditions are not particularly limited and may be suitably selected in accordance with the intended use.

Preferred examples of the other steps include a surfactant coating step, and a developing step.

The surfactant coating step is a step for applying the surfactant on the surface of the resist pattern before the resist pattern forming step.

The surfactant is not particularly limited, may be suitably selected in accordance with the intended use, and preferred examples thereof are the surfactants described above. Specific examples include polyoxyethylene-polyoxypropylene condensation compounds, polyoxy alkylene alkyl ether compounds, polyoxy ethylene alkyl ether compounds, polyoxy ethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid esters, amides, natural alcohols, ethylenediamine surfactants, secondary alcohol ethoxylate surfactants, alkyl cationic surfactants, amide quaternary cationic surfactants, ester quaternary cationic surfactants, amine oxide surfactants, betaine surfactants.

The developing step is a step for developing the applied resist pattern thickening material after the resist pattern forming step and before the patterning step. The developing step is as described above.

By using the method for manufacturing a semiconductor device of the present invention, various conductor devices, typified by, for example, flash memories, DRAMs, FRAMs can be efficiently manufactured.

EXAMPLES

Hereafter, the present invention will be described in detail referring to specific examples, however, the present invention is not limited to the disclosed examples.

Experiment of Thickening Resist Pattern

A thickened resist pattern was formed using the resist composition of the present invention, according to the following procedures.

A resist composition having the following composition was prepared.

| | |
|---|---|
| Resin*[1] | 12 parts by mass |
| Triphenylsulfonium nonafluorobutane sulfonate | 0.48 parts by mass |
| Adamantane acetic acid*[2] | 0.12 parts by mass |
| Propyleneglycol methyl ether acetate | 100 parts by mass |

*[1]resin represented by the following Structural Formula (9) which was synthesized by the method described in Example 13 in the section of Examples of Japanese Patent No. 3297272.
*[2]adamantane acetic acid represented by the following Structural Formula (2), having a melting point of around 135° C.

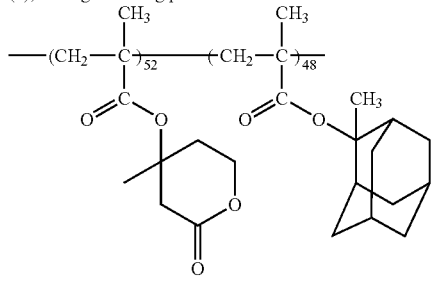

Structural Formula (9)

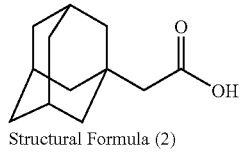

Structural Formula (2)

Formation of Resist Pattern

As shown in FIG. 4, a region for device elements was provided on a semiconductor substrate 5 by a known conventional method, and then for example, a silicon oxide film was formed over the region for device elements by a chemical vapor deposition (CVD) method as an inter-layer dielectric. Then, the prepared resist composition 3a was applied over the entire flat surface of the inner dielectric by spin-coating at 3,500 rpm for 20 seconds, and the resist film was pre-baked at 110° C. for 60 seconds. Next, as shown in FIG. 5, ArF excimer laser light was exposed on the resist pattern through a mask at an exposure dose of 20 mJ/cm² and then the resist film was baked at 90° C. for 60 seconds. Then, the baked resist film was developed with 2.3% by mass of a TMAH aqueous solution for 1 minute to thereby form a hole pattern 3 having a diameter of 150 nm. The obtained resist pattern 3 had a thickness of around 250 nm.

Next, as shown in FIG. 6, over the surface of the thus obtained resist pattern, a commercially available resist pattern thickening material 1 (AZ R600™, available from AZ Electronic Materials) was applied by spin-coating at 3,500 rpm for 60 seconds, and the applied resist pattern thickening material was baked at 135° C. being the melting point of adamantane acetic acid, for 60 seconds. Then, as shown in FIG. 7, an interaction i.e. mixing or infiltration, of the resist pattern thickening material 1 with the resist pattern 3 took place at the interface between the resist pattern 3 and the resist pattern thickening material 1, and the mixed portions or infiltrated portions interacted to each other. Thereafter, as shown in FIG. 8, the resist pattern thickening material 1 was rinsed with pure water for 60 seconds so as to remove non-reacted portions where no interaction occurred, and the resist pattern 3 which had been thickened with the resist pattern thickening material 1 was developed to thereby form a thickened resist pattern 10. The diameter of the resist pattern 3 after thickening (thickened resist pattern 10) was 130 nm, and it was verified that the diameter of the resist pattern 3 had been reduced.

Example 1

Preparation of Resist Composition

A resist composition having the following composition was prepared.

| | |
|---|---|
| Resin*[1] | 12 parts by mass |
| Triphenylsulfonium nonafluorobutane sulfonate | 0.48 parts by mass |
| Trioctylamine | 0.01 parts by mass |
| Norbornanon*[2] | 0.12 parts by mass |
| Surfactant*[3] | 0.005 parts by mass |
| Propyleneglycol methyl ether acetate | 100 parts by mass |

*[1]resin represented by the following Structural Formula (9) which was synthesized by the method described in Example 13 in the section of Examples of Japanese Patent No. 3297272.
*[2]norbornanon represented by the following Structural Formula (6), having a melting point of around 95° C.
*[3]KP-341, available from Shin-Etsu Chemical Co., Ltd.

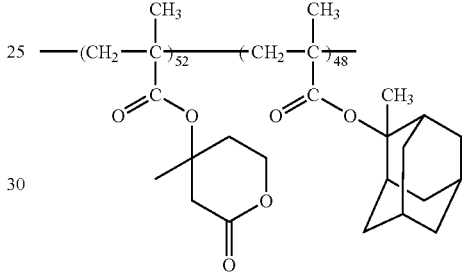

Structural Formula (9)

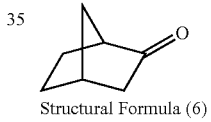

Structural Formula (6)

Formation of Resist Pattern

The thus prepared resist composition of the present invention was applied over the entire surface of a silicon wafer (available from Mitsubishi Material Corporation) by spin-coating at 3,500 rpm for 20 seconds, and the coated resist film was pre-baked at 110° C. for 60 seconds. ArF excimer laser light was applied thereto through a mask at an exposure dose of 20 mJ/cm² and then the resist film was baked at 90° C. for 60 seconds. Then, the baked resist film was developed with 2.38% by mass of a TMAH aqueous solution for 1 minute to thereby form a resist pattern of single rectangle 120 nm×500 nm in size. The obtained resist pattern had a thickness of around 250 nm.

Over the surface of the thus obtained resist pattern, a resist pattern thickening material (AZ R500™, available from AZ Electronic Materials) was applied by spin-coating at 3,500 rpm for 60 seconds, and the applied resist pattern thickening material was baked at 100° C., i.e. at a temperature slightly higher than the melting point of norbornanon, for 60 seconds. The resist pattern thickening material was rinsed with pure water for 60 seconds so as to remove non-reacted portions where no interaction occurred, and the resist pattern which had been thickened with the resist pattern thickening material was developed to thereby form a thickened resist pattern.

Figure 28A:
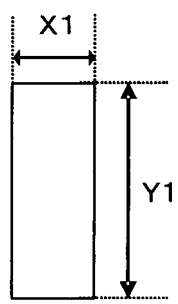
FIG. 28A is a schematic diagram for explaining an example of the resist pattern of Example 1 before the resist pattern is thickened.
Figure 28B:
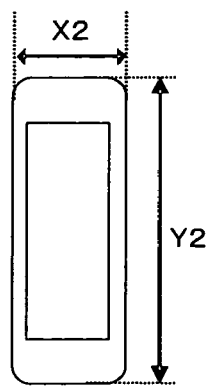
FIG. 28B is a schematic diagram for explaining an example of the resist pattern of Example 1 after the resist pattern is thickened.

The resist pattern before thickening (the resist pattern) was illustrated in FIG. 28A, and the resist pattern after thickening (the thickened resist pattern) was illustrated in FIG. 28B. The sizes of the narrow side direction, X1 and X2, and the sizes of the wide side direction, Y1 and Y2, were measured, respectively. Thereafter, the variations of the pattern size along the narrow side direction, i.e. X2−X1, and the variations of the pattern size along the wide side direction, i.e. Y2−Y1, were calculated. The variations of the pattern size were 22 nm in the narrow side direction and 25 nm in the wide side direction. Accordingly, it was found that the use of the resist composition of Example 1 allowed uniformly thickening the resist pattern with less dependency on the direction of the resist pattern.

Comparative Example 1

A thickened resist pattern was formed in the same manner as in Example 1 except that norbornanon was not added at the time of preparation of the resist composition. The variations of the pattern sizes in the narrow side direction and the wide side direction were calculated, respectively. There was no variation of the pattern size in the narrow side direction, and the variation of the pattern size in the wide side direction was 3 nm. Accordingly, it was found that the resist composition of Comparative Example 1 prepared without adding norbornanon did not cause an interaction (mixing) between the resist pattern and the resist pattern thickening material.

Example 2

A thickened resist pattern was formed in the same manner as in Example 1 except that the resist pattern thickening material (AZ R500™, available from AZ Electronic Materials) suited for ArF excimer laser light was replaced by a resist pattern thickening material (AZ R600™, available from AZ Electronic Materials) suited for ArF excimer laser light. The variations of the pattern sizes in the narrow side direction and the wide side direction were calculated, respectively. The variations of the pattern size were 30 nm in the narrow side direction and 32 nm in the wide side direction. Accordingly, it was found that the use of the resist composition of the present invention allowed uniformly thickening the resist pattern and without depending on the components of the resist pattern thickening material.

Comparative Example 2

A thickened resist pattern was formed in the same manner as in Example 2 except that no norbornanon was added at the time of preparation of the resist composition. The variations of the pattern sizes in the narrow side direction and the wide side direction were calculated, respectively. The variations of the pattern size were 13 nm in the narrow side direction and 23 nm in the wide side direction. Accordingly, the resist composition of Comparative Example 2 prepared without adding norbornanon varied the thickening amounts depending on the direction of the resist pattern, and especially the thickening amount along the wide side direction was larger than the thickening amount along the narrow side direction.

Example 3

A thickened resist pattern was formed in the same manner as in Example 1 except that the resist composition was prepared based on the following composition. The variations of the pattern sizes in the narrow side direction and the wide side direction were measured, respectively.

Preparation of Resist Composition

ArF resist (AX5910, available from Sumitomo Chemical Co., Ltd.)  5 g
1-adamantylmethanol*[1]  3 mg

*[1]1-adamantylmethanol represented by the following Structural Formula (1), having a melting point of around 115° C.
Note that as the ArF resist (AX5910) is a commercially available product, the exact concentration of the resin is unknown, however, the content of 1-adamantylmethanol to the mass of the base resin is estimated to be around 0.5% by mass.

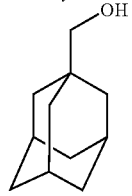

Structural Formula (1)

Formation of Resist Pattern

A resist pattern was formed in the same manner as in Example 1, by using the obtained resist composition. Over the surface of the thus obtained resist pattern, a resist pattern thickening material (AZ R600™, available from AZ Electronic Materials) was applied by spin-coating at 3,500 rpm for 60 seconds, and the applied resist pattern thickening material was baked at 115° C., i.e. at a temperature slightly higher than the melting point of 1-adamantylmethanol, for 60 seconds. The resist pattern thickening material was rinsed with pure water for 60 seconds so as to remove non-reacted portions where no interaction occurred, and the resist pattern which had been thickened with the resist pattern thickening material was developed to thereby form a thickened resist pattern.

The variations of the pattern size were measured and resulted in 31 nm in the narrow side direction and 35 nm in the wide side direction. Accordingly, it was found that the use of the resist composition of Example 3 allowed uniformly thickening the resist pattern with less dependency on the direction of the resist pattern.

Comparative Example 3

A thickened resist pattern was formed in the same manner as in Example 3 except that 1-adamantylmethanol was not added at the time of preparation of the resist composition. The variations of the pattern sizes in the narrow side direction and the wide side direction were calculated, respectively. The variations of the pattern size were 18 nm in the narrow side direction and 28 nm in the wide side direction. Accordingly, the resist composition of Comparative Example 3 prepared without adding 1-adamantylmethanol varied the thickening amounts depending on the direction of the resist pattern, and especially the thickening amount along the wide side direction was larger than the thickening amount along the narrow side direction.

Example 4

Figure 29:
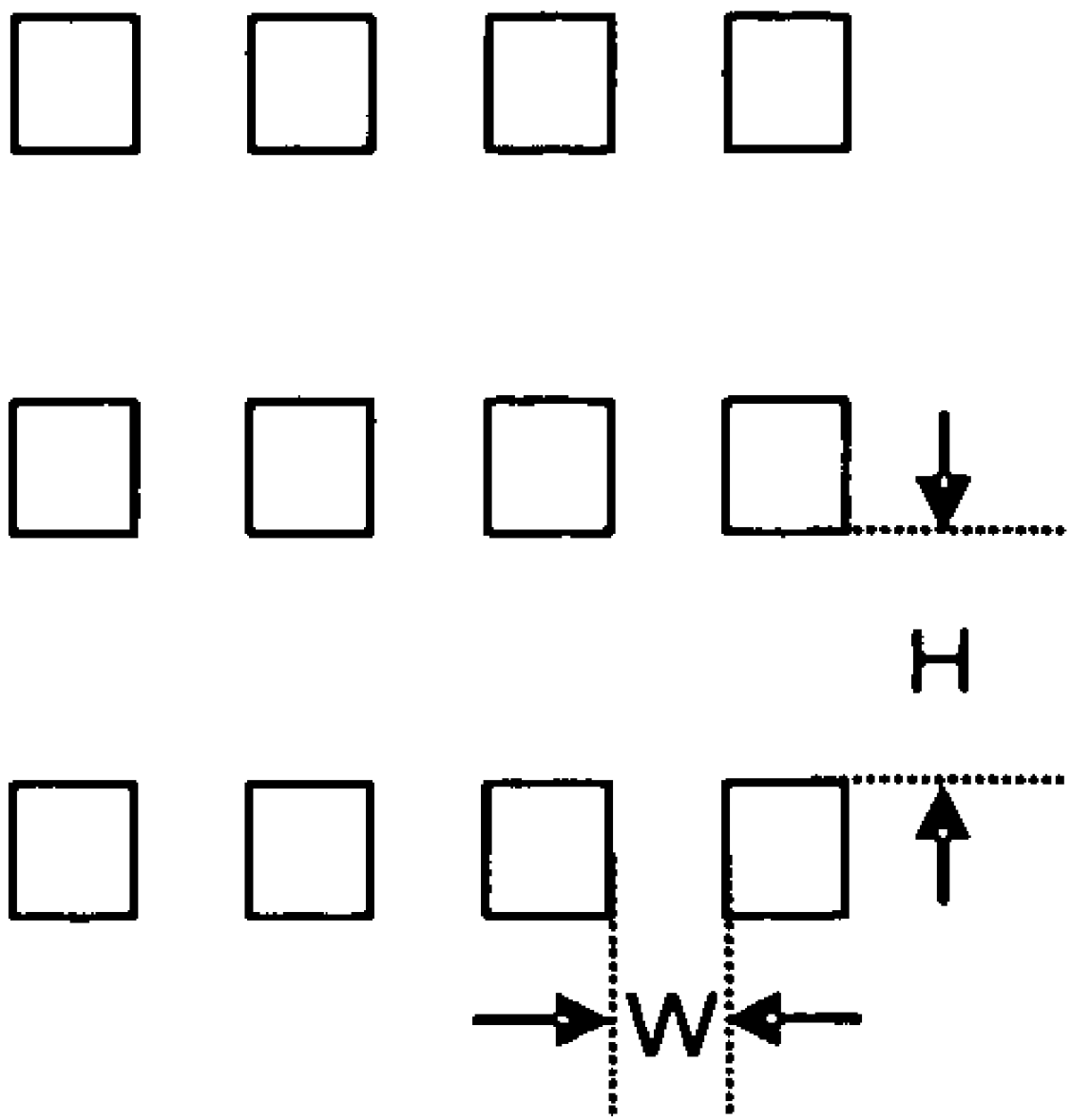
FIG. 29 is a schematic diagram for explaining an example of the resist pattern of Example 4 before the resist pattern is thickened.

A thickened resist pattern was formed in the same manner as in Example 3 except that a resist pattern was formed in the pattern shape as illustrated in FIG. 29. In FIG. 29, the pattern shape was such that four squares were aligned in a width direction, and three squares were aligned in a length direction, in which each of the squares had a side of 200 nm, and space portions between the squares were respectively 200 nm in the width direction W and 600 nm in the length direction H.

The size variations of the twelve squares of the resist pattern were respectively calculated in the width direction and in the length direction, in the same manner as in Example 3, and the average amounts were calculated. The size variations of the pattern were 32 nm in the narrowly arrayed pattern direction and 30 nm in the sparsely arrayed pattern direction. Accordingly, it was found that the use of the resist composition of Example 3 allowed uniformly thickening the resist pattern with less dependency on the spacing variations of the resist pattern.

Comparative Example 4

A resist pattern was formed in the pattern shape as illustrated in FIG. 29 and thickened in the same manner as in Example 4 except that the composition was replaced by the resist composition of Comparative Example 3. The average values of the variations of the pattern size were measured and resulted in 25 nm in the narrowly arrayed pattern direction and 16 nm in the sparsely arrayed pattern direction. Accordingly, it was found that the resist composition of Comparative Example 3 significantly varied the thickening amounts depending on the spacing variations of the resist pattern, and especially the thickening amount in the narrow spacing direction was large.

Example 5

Preparation of Resist Composition
A resist composition having the following composition was prepared.

| | |
|---|---|
| ArF resist (AR1244J, available from JSR Corporation) | 5 g |
| Noradamantane carboxylic acid*[1] | 2 mg |

*[1] noradamantane carboxylic acid represented by the following Structural Formula (5), having a melting point of around 105° C.
Note that as the ArF resist (AR1244J) is a commercially available product, the exact concentration of the resin is unknown, however, the content of noradamantane carboxylic acid to the mass of the base resin is estimated to be around 0.2% by mass to 0.4% by mass.

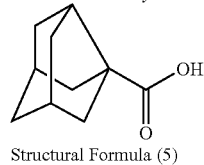

Structural Formula (5)

Formation of Resist Pattern
The thus prepared resist composition of the present invention was applied over the entire surface of a silicon wafer (available from Mitsubishi Material Corporation) by spin-coating at 3,500 rpm for 20 seconds, and the coated resist film was pre-baked at 110° C. for 60 seconds. ArF excimer laser light was applied thereto through a mask at an exposure dose of 25 mJ/cm$^2$ and then the resist film was baked at 110° C. for 60 seconds. Then, the baked resist film was developed with 2.38% by mass of a TMAH aqueous solution for 1 minute to thereby form a resist pattern of single rectangle 120 nm×500 nm in size. The obtained resist pattern had a thickness of 250 nm.

Preparation of Resist Pattern Thickening Material
A resist pattern thickening material having the following composition was prepared in accordance with the method described in Japanese Patent Application Laid-Open (JP-A) No. 2003-131400 (patent application from the present inventors).

| | |
|---|---|
| Polyvinyl acetal resin*[1] | 16 parts by mass |
| Tetramethoxymethylglycoluril*[2] | 1.35 parts by mass |
| Pure water | 98.6 parts by mass |
| Isopropyl alcohol*[3] | 0.4 parts by mass |
| Nonionic surfactant*[4] | 0.12 parts by mass |

*[1] KW-3, available from Sekisui Chemical Co., Ltd.
*[2] crosslinker, available from Sanwa Chemical Co., Ltd.
*[3] available from KANTO KAGAKU
*[4] multinucleate phenol surfactant, TN-80, available from ADEKA CORPORATION Over the surface of the obtained resist pattern, the thus prepared resist pattern thickening material was applied by spin-coating at 3,500 rpm for 20 seconds, and the applied resist pattern thickening material was baked at 105° C., i.e. at a temperature near the melting point of noradamantane carboxylic acid, for 60 seconds. The resist pattern thickening material was rinsed with pure water for 60 seconds so as to remove non-reacted portions where no interaction occurred, and the resist pattern which had been thickened with the resist pattern thickening material was developed to thereby form a thickened resist pattern.

The variations of the pattern size were 41 nm in the narrow side direction and 45 nm in the wide side direction. Accordingly, it was found that the use of the resist composition of the present invention allowed uniformly thickening the resist pattern with less dependency on the direction of the resist pattern, even when a resist pattern thickening material containing a crosslinker was used in the resist composition.

Comparative Example 5

A thickened resist pattern was formed in the same manner as in Example 5 except that noradamantane carboxylic acid was not added at the time of preparation of the resist composition. The variations of the pattern sizes in the narrow side direction and the wide side direction were calculated, respectively. The variations of the pattern size were 20 nm in the narrow side direction and 40 nm in the wide side direction. Accordingly, it was found that the resist composition of Comparative Example 5 prepared without adding noradamantane carboxylic acid significantly varied the thickening amounts depending on the direction of the resist pattern, and especially the thickening amount along the wide side direction was larger than the thickening amount along the narrow side direction.

Example 6

Preparation of Resist Composition
A resist composition having the following composition was prepared.

| | |
|---|---|
| Resin*[1] | 12 parts by mass |
| Triphenylsulfonium nonafluorobutanesulfonate | 0.48 parts by mass |
| Trioctylamine | 0.01 parts by mass |
| Exo-norborneol*[2] | 0.12 parts by mass |
| Surfactant*[3] | 0.005 parts by mass |
| Propyleneglycol methylether acetate | 100 parts by mass |

*[1] resin represented by the following Structural Formula (10), which was synthesized in accordance with the method described in U.S. Pat. No. 6849378.
*[2] exo-norborneol represented by the following Structural Formula (8), having a melting point of around 125° C.

-continued

*³KP-341, available from Shin-Etsu Chemical Co., Ltd.

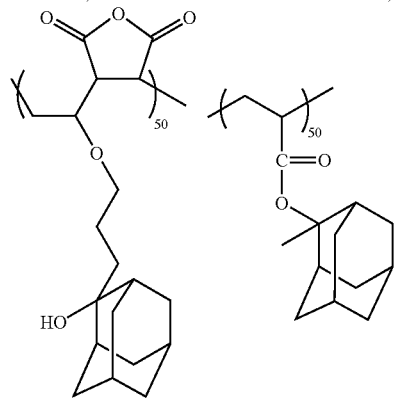

Structural Formula (10)

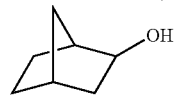

Structural Formula (8)

Formation of Resist Pattern

The thus prepared resist composition of the present invention was applied over the entire surface of a silicon wafer (available from Mitsubishi Material Corporation) by spin-coating at 3,500 rpm for 20 seconds, and the coated resist film was pre-baked at 110° C. for 60 seconds. ArF excimer laser light was applied thereto through a mask at an exposure dose of 25 mJ/cm² and then the resist film was baked at 110° C. for 60 seconds. Then, the baked resist film was developed with 2.38% by mass of a TMAH aqueous solution for 1 minute to thereby form a resist pattern of single rectangle 120 nm×500 nm in size. The obtained resist pattern had a thickness of 250 nm.

Preparation of Resist Pattern Thickening Material

| Polyvinyl alcohol resin*¹ | 4 parts by mass |
|---|---|
| 2-hydroxylbenzyl alcohol*² | 1 part by mass |
| Pure water | 100 parts by mass |
| Nonionic surfactant*³ | 0.06 parts by mass |

*¹PVA-205C, available from KURARAY Co., Ltd.
*²available from Aldrich
*³multinucleate phenol surfactant, PC-6, available from ADEKA Corporation Over the surface of the obtained resist pattern, the thus prepared resist pattern thickening material was applied by spin-coating at 3,500 rpm for 20 seconds, and the applied resist pattern thickening material was baked at 120° C., i.e. at a temperature near the melting point of exo-norborneol, for 120 seconds. The resist pattern thickening material was rinsed with pure water for 60 seconds so as to remove non-reacted portions where no interaction occurred, and the resist pattern which had been thickened with the resist pattern thickening material was developed to thereby form a thickened resist pattern.

The variations of the pattern size were measured and resulted in 30 nm in the narrow side direction and 36 nm in the wide side direction. Accordingly, it was found that the use of the resist composition of the present invention allowed uniformly thickening the resist pattern with less dependency on the direction of the resist pattern and without depending on components of the resist pattern thickening material.

Comparative Example 6

A thickened resist pattern was formed in the same manner as in Example 6 except that exo-norborneol was not added at the time of preparation of the resist composition. The variations of the pattern sizes in the narrow side direction and the wide side direction were calculated, respectively. The variations of the pattern size were 16 nm in the narrow side direction and 20 nm in the wide side direction. Accordingly, it was found that the resist composition of Comparative Example 6 prepared without adding exo-norborneol reduced the thickening amounts.

Example 7

A thickened resist pattern was formed in the same manner as in Example 6 except that the resist composition was prepared based on the following composition. The variations of the pattern sizes in the narrow side direction and the wide side direction were calculated, respectively.

Preparation of Resist Composition

A resist composition having the following composition was prepared.

| Resin*¹ | 12 parts by mass |
|---|---|
| Triphenylsulfonium nonafluorobutanesulfonate | 0.48 parts by mass |
| Trioctylamine | 0.01 parts by mass |
| 5-norbornene-2,2-dimethanol*² | 0.12 parts by mass |
| Surfactant*³ | 0.005 parts by mass |
| Propyleneglycol methylether acetate | 100 parts by mass |

*¹resin represented by the following Structural Formula (11), which was synthesized in accordance with the method described in U.S. Pat. No. 5843624.
*²5-norbornene-2,2-dimethanol represented by the following Structural Formula (7), having a melting point of around 112° C.
*³KP-341, available from Shin-Etsu Chemical Co., Ltd.

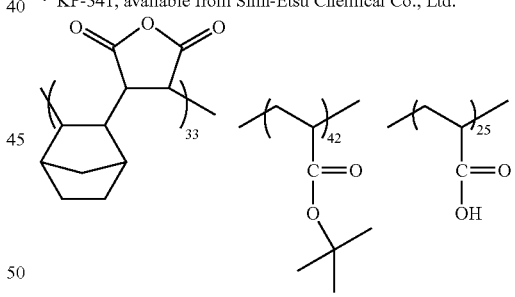

Structural Formula (11)

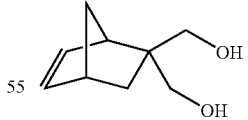

Structural Formula (7)

Formation of Resist Pattern

The obtained resist composition was applied over a surface of the silicon wafer, and the coated resist film was pre-baked at 110° C. for 60 seconds. ArF excimer laser light was applied thereto through a mask at an exposure dose of 25 mJ/cm² and then the resist film was baked at 105° C. for 60 seconds. Then, the baked resist film was developed with 2.38% by mass of a TMAH aqueous solution for 1 minute to thereby form a resist pattern of single rectangle having a size of 120 nm×500 nm and a thickness of around 250 nm. Over the surface of the obtained resist pattern, the prepared resist pattern thickening material was applied in the same manner as in Example 6, and the applied resist pattern thickening material was baked at 110° C., i.e. at a temperature near the melting point of 5-norbornene-2,2-dimethanol, for 60 seconds. The resist pattern thickening material was rinsed with pure water for 60 seconds so as to remove non-reacted portions where no interaction occurred, and the resist pattern which had been thickened with the resist pattern thickening material was developed to thereby form a thickened resist pattern.

The variations of the pattern size were measured and resulted in 38 nm in the narrow side direction and 40 nm in the wide side direction. Accordingly, it was found that the use of the resist composition of the present invention allowed uniformly thickening the resist pattern with less dependency on the direction of the resist pattern and without depending on components of the resist pattern thickening material.

Comparative Example 7

A thickened resist pattern was formed in the same manner as in Example 7 except that 5-norbornene-2,2-dimethanol was not added at the time of preparation of the resist composition. The variations of the pattern sizes in the narrow side direction and the wide side direction were calculated, respectively. The variations of the pattern size were 11 nm in the narrow side direction and 15 nm in the wide side direction. Accordingly, it was found that the resist composition of Comparative Example 7 prepared without adding 5-norbornene-2,2-dimethanol reduced the thickening amounts.

Example 8

Formation of Resist Composition

A resist composition having the following composition was prepared.

| | |
|---|---|
| Resin*[1] | 14 parts by mass |
| Triphenylsulfonium nonafluorobutanesulfonate | 0.7 parts by mass |
| Trioctylamine | 0.01 parts by mass |
| Norbornanon*[2] | 0.12 parts by mass |
| Surfactant*[3] | 0.005 parts by mass |
| Propyleneglycol methylether acetate | 100 parts by mass |

*[1]resin represented by the following Structural Formula (11), which was synthesized in accordance with the method described in Examples 1 and 2 of U.S. Pat. No. 5492793.
*[2]norbornanon represented by the following Structural Formula (6), having a melting point of around 95° C.
*[3]KP-341, available from Shin-Etsu Chemical Co., Ltd.

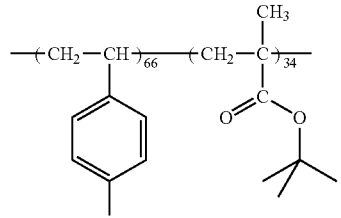
Structural Formula (11)

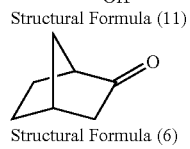
Structural Formula (6)

Formation of Resist Pattern

The thus prepared resist composition of the present invention was applied over the entire surface of a silicon wafer (available from Mitsubishi Material Corporation) by spin-coating at 3,500 rpm for 20 seconds, and the coated resist film was pre-baked at 150° C. for 60 seconds. Next, KrF excimer laser light was applied thereto through a mask at an exposure dose of 40 mJ/cm$^2$ and then the resist film was baked at 130° C. for 60 seconds. Then, the baked resist film was developed with 2.38% by mass of a TMAH aqueous solution for 1 minute to thereby form a resist pattern of single rectangle 300 nm×1,000 nm in size. The obtained resist pattern had a thickness of around 450 nm.

Over the surface of the obtained resist pattern, a resist pattern thickening material (AZ R500™, available from AZ Electronic Materials) was applied by spin-coating at 3,500 rpm for 60 seconds, and the applied resist pattern thickening material was baked at 100° C., i.e. at a temperature slightly higher than the melting point of norbornanon, for 60 seconds. The resist pattern thickening material was rinsed with pure water for 60 seconds so as to remove non-reacted portions where no interaction occurred, and the resist pattern which had been thickened with the resist pattern thickening material was developed to thereby form a thickened resist pattern.

The variations of the pattern size were measured and resulted in 47 nm in the narrow side direction and 51 nm in the wide side direction. Accordingly, it was found that the use of the resist composition of the present invention allowed uniformly thickening the resist pattern with less dependency on the direction of the resist pattern even when a KrF resist was used as a resist material.

Example 9

A thickened resist pattern was formed in the same manner as in Example 1 except that the content of norbornanon was changed from 0.12 parts by mass (1% by mass relative to the mass of the resin) to 0.001 parts by mass (0.008% by mass relative to the mass of the resin). The variations of the pattern size were measured and resulted in 5 nm in the narrow side direction and 8 nm in the wide side direction. Accordingly, it was found that the use of the resist composition caused reduced thickening amounts, although there was less dependency on the direction of the resist pattern.

Example 10

A thickened resist pattern was formed in the same manner as in Example 1 except that the content of norbornanon was changed from 0.12 parts by mass (1% by mass of the mass of the resin) to 0.66 parts by mass (5.5% by mass of the mass of the resin). The variations of the pattern size were measured and resulted in 27 nm in the narrow side direction and 33 nm in the wide side direction. However, residues of insoluble matter were observed in the space portions of the resist pattern.

Comparative Example 8

A thickened resist pattern was formed in the same manner as in Example 1 except that the alicyclic compound to be added was changed from norbornanon having a melting point of around 95° C. to a norbornanon having a melting point of around 85° C. The variations of the pattern size were measured and resulted in 7 nm in the narrow side direction and 15 nm in the wide side direction. Accordingly, it was found that the resist composition of Comparative Example 8 significantly varied the thickening amounts depending on the direction of the resist pattern, and especially the thickening amount along the wide side direction was larger than the thickening amount along the narrow side direction.

Comparative Example 9

A thickened resist pattern was formed in the same manner as in Example 1 except that the alicyclic compound to be added was changed from a norbornanon having a melting point of around 95° C. to 1,7,7-trimethylbicyclo(2,1,1)heptane-2-on having a melting point of around 175° C.). The variations of the pattern size were measured, and there was no variation in the narrow side direction and 5 nm in the wide side direction. Accordingly, it was found that the resist composition of Comparative Example 9 had no variation of pattern size in the narrow side direction, but had a variation of pattern size of 5 nm in the wide side direction.

Table 1A and 1B show respective variations of pattern size on the measured resist patterns in Examples 1 to 10 and Comparative Examples 1 to 9. In Table 1, "Content" means the content (% by mass) of the respective alicyclic compound having a melting point of 90° C. to 150° C. relative to the mass of the resist base-resin.

TABLE 1-A

| | Resist material | Thickening material | Alicyclic compound having a melting point of 90° C. to 150° C. | | | Variation of pattern size (nm) | | | |
|---|---|---|---|---|---|---|---|---|---|
| | | | Alicyclic compound | melting point (° C.) | Content (% by mass) | Narrow side direction | Wide side direction | Closely arrayed pattern | Sparsely arrayed pattern |
| Ex. 1 | ArF | KrF | Norbornanon | 95 | 1 | 22 | 25 | — | — |
| Compara. Ex. 1 | ArF | KrF | — | — | — | — | 3 | — | — |
| Ex. 2 | ArF | ArF | Norbornanon | 95 | 1 | 30 | 32 | — | — |
| Compara. Ex. 2 | ArF | ArF | — | — | — | 13 | 23 | — | — |
| Ex. 3 | ArF | ArF | 1-adamantylmethanol | 115 | 0.5 | 31 | 35 | — | — |
| Compara. Ex. 3 | ArF | ArF | — | — | — | 18 | 28 | — | — |
| Ex. 4 | ArF | ArF | 1-adamantylmethanol | 115 | 0.5 | — | — | 32 | 30 |
| Compara. Ex. 4 | ArF | ArF | — | — | — | — | — | 25 | 16 |
| Ex. 5 | ArF | ArF containing crosslinker | Noradamantane carboxylic acid | 105 | 0.2-0.4 | 41 | 45 | — | — |
| Compara. Ex. 5 | ArF | ArF containing crosslinker | — | — | — | 20 | 40 | — | — |

TABLE 1-B

| | Resist material | Thickening material | Alicyclic compound having a melting point of 90° C. to 150° C. | | | Variation of pattern size (nm) | | | |
|---|---|---|---|---|---|---|---|---|---|
| | | | Alicyclic compound | melting point (° C.) | Content (% by mass) | Narrow side direction | Wide side direction | Closely arrayed pattern | Sparsely arrayed pattern |
| Ex. 6 | ArF | ArF containing compound or General Formula (1) | exo-norborneol | 125 | 1 | 30 | 36 | — | — |
| Compara. Ex. 6 | ArF | ArF containing compound or General Formula (1) | — | — | — | 16 | 20 | — | — |
| Ex. 7 | ArF | ArF containing compound of General Formula (1) | 5-norbornen-2,2-dimethanol | 112 | 1 | 38 | 40 | — | — |
| Compara. Ex. 7 | ArF | ArF containing compound of General Formula (1) | — | — | — | 11 | 15 | — | — |
| Ex. 8 | KrF | KrF | Norbornanon | 95 | 0.86 | 47 | 51 | — | — |
| Ex. 9 | ArF | KrF | Norbornanon | 95 | 0.008 | 5 | 8 | — | — |
| Ex. 10 | ArF | KrF | Norbornanon | 95 | 5.5 | 27 Residues observed | 33 Residues observed | — | — |
| Compara. Ex. 8 | ArF | KrF | Norbornane | 85 | 1 | 7 | 15 | — | — |
| Compara. Ex. 9 | ArF | KrF | 1,7,7-trimethyl-bicyclo(2,2,1)heptane-2-on | 175 | 1 | — | 5 | — | — |

From the results shown in Tables 1-A and 1B, it was found that the resist patterns formed by use of the resist composition of the present invention had been efficiently and uniformly thickened.

Example 11

Flash Memory and Manufacture Thereof

Example 11 illustrates an embodiment of the semiconductor device and the manufacturing process thereof of the present invention using a resist pattern thickening material of the present invention. In Example 11, resist films 26, 27, 29 and 32 are ones thickened by the same method as in Examples 1 to 10 using the resist pattern thickening material of the present invention.

Figure 9:
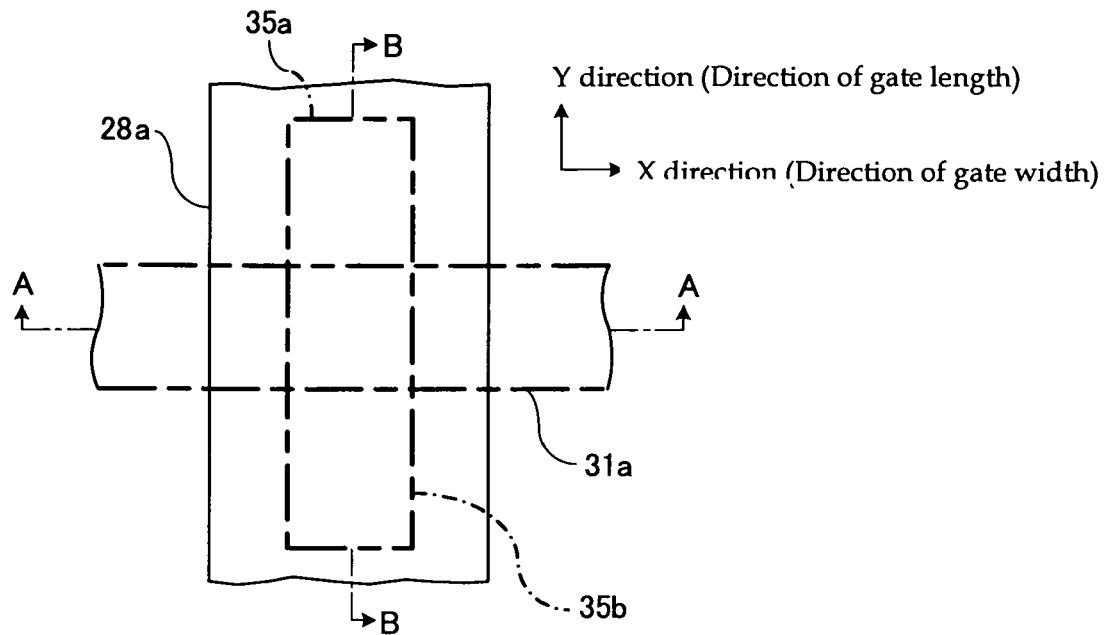
FIG. 9 is a top view for explaining a FLASH EPROM which is one example of a semiconductor device manufactured by the method for manufacturing a semiconductor device of the present invention.
Figure 10:
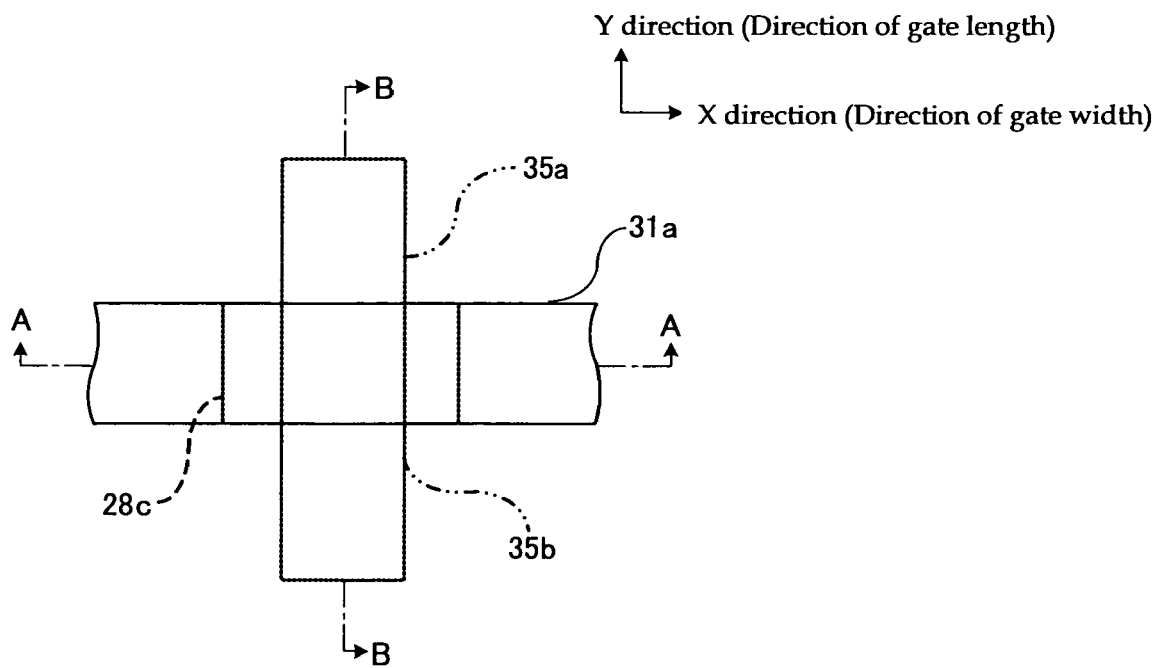
FIG. 10 is a top view for explaining a FLASH EPROM which is another example of a semiconductor device manufactured by the method for manufacturing a semiconductor device of the present invention.

FIGS. 9 and 10 are top views (plan views) of a FLASH EPROM which is called a FLOTOX type or an ETOX type. FIGS. 11 through 19 are schematic cross-sectional views showing a manufacturing process of the FLASH EPROM. In these figures, the left views are schematic sectional views (sectional views taken along lines A-A) of a memory cell unit (a first element region), in a gate width direction (in the X direction in FIGS. 9 and 10), in a portion where a MOS transistor having a floating gate electrode is to be formed. The central views are schematic sectional views (sectional views taken along lines B-B) of the memory cell unit in a gate length direction (in the Y direction in FIGS. 9 and 10) perpendicular to the X direction in the same portion in the left views. The right views are schematic sectional views (sectional views taken along the line A-A in FIGS. 9 and 10) of a portion on which a MOS transistor is to be formed in a peripheral circuit unit (a second element region).

Figure 11:
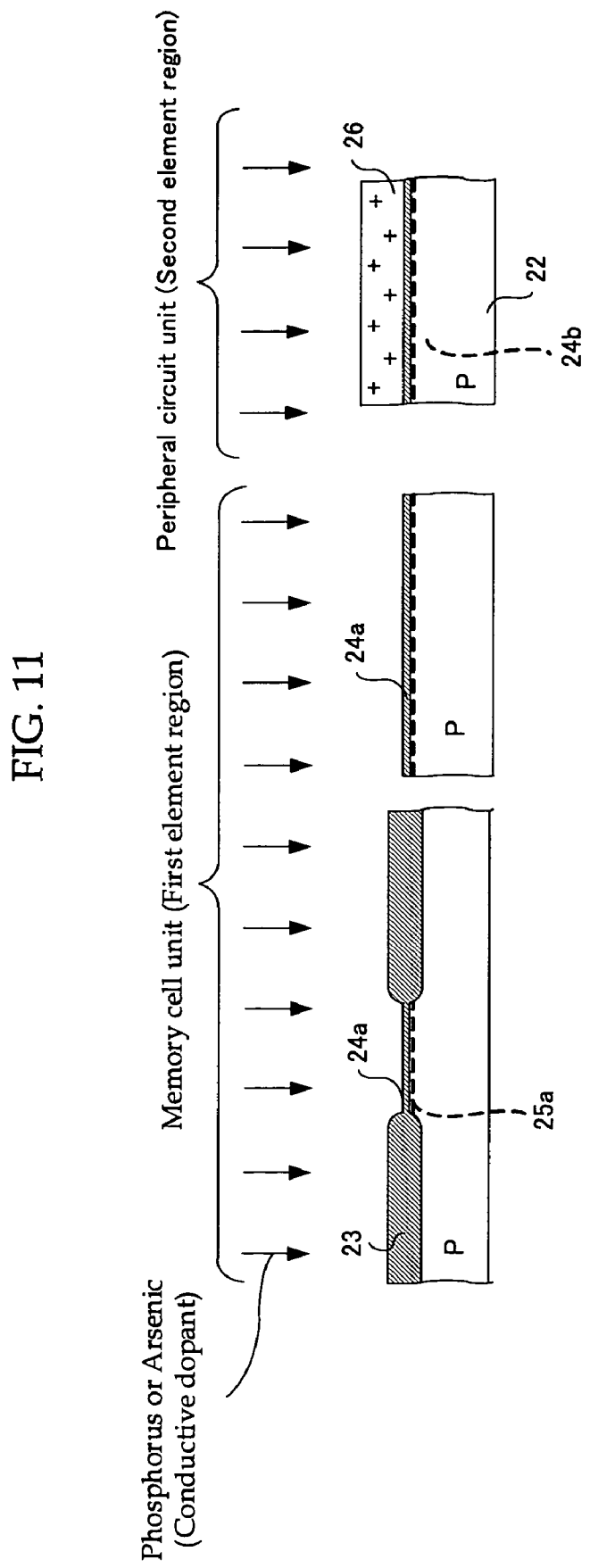
FIG. 11 is a cross-sectional schematic diagram for explaining a method for manufacturing the FLASH EPROM which is an example of the method for manufacturing a semiconductor device of the present invention.

Initially, a $SiO_2$ film was selectively formed in a device isolation region on a p-type Si substrate 22 and thereby yielded a field oxide film 23 of $SiO_2$ film (FIG. 11). Next, a $SiO_2$ film was formed by thermal oxidation so as to have a thickness of 10 nm to 30 nm (100 to 300 angstroms) as a first gate dielectric film 24a in the MOS transistor in the memory cell unit (first element region). In another step, a $SiO_2$ film was formed by thermal oxidation so as to have a thickness of 10 nm to 50 nm (100 to 500 angstroms) as a second gate dielectric film 24b in the MOS transistor in the peripheral circuit unit (second element region). If the first gate dielectric film 24a and the second gate dielectric film 24b should have the same thickness, these oxide films may be simultaneously formed in one step.

Next, the peripheral circuit unit (the right view in FIG. 11) was masked by a resist film 26 to control a threshold voltage for the formation of a MOS transistor having n-type depletion type channels in the memory cell unit (the left and central views in FIG. 11). As an n-type dopant, phosphorus (P) or arsenic (As) was injected into a region to be a channel region directly below the floating gate electrode by ion implantation at a dose of $1 \times 10^{11}$ $cm^{-2}$ to $1 \times 10^{14}$ $cm^{-2}$ and thereby yielded a first threshold control layer 25a. The dose and conduction type of the dopant can be appropriately selected depending on whether the channel is a depletion type or an accumulation type.

Figure 12:
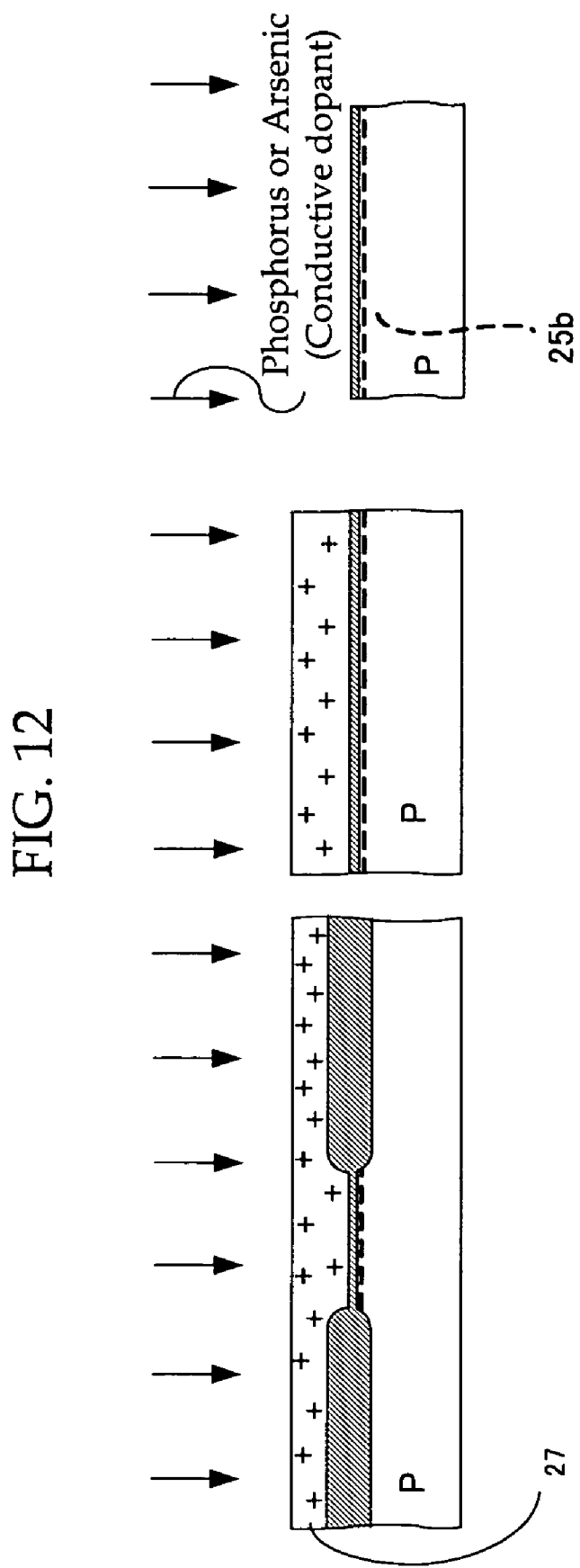
FIG. 12 is a cross-sectional schematic diagram for explaining a method for manufacturing the FLASH EPROM which is an example of the method for manufacturing a semiconductor device of the present invention, and showing a step after the step shown in FIG. 11.

Next, the memory cell unit (the left and central views in FIG. 12) was masked by a resist film 27 to control a threshold voltage for the formation of a MOS transistor having n-type depletion type channels in the peripheral circuit unit (the right view in FIG. 12). As an n-type dopant, phosphorus (P) or arsenic (As) was injected into a region to be a channel region directly below the gate electrode by ion implantation at a dose of $1 \times 10^{11}$ $cm^{-2}$ to $1 \times 10^{14}$ $cm^{-2}$ and thereby yielded a second threshold control layer 25b.

Figure 13:
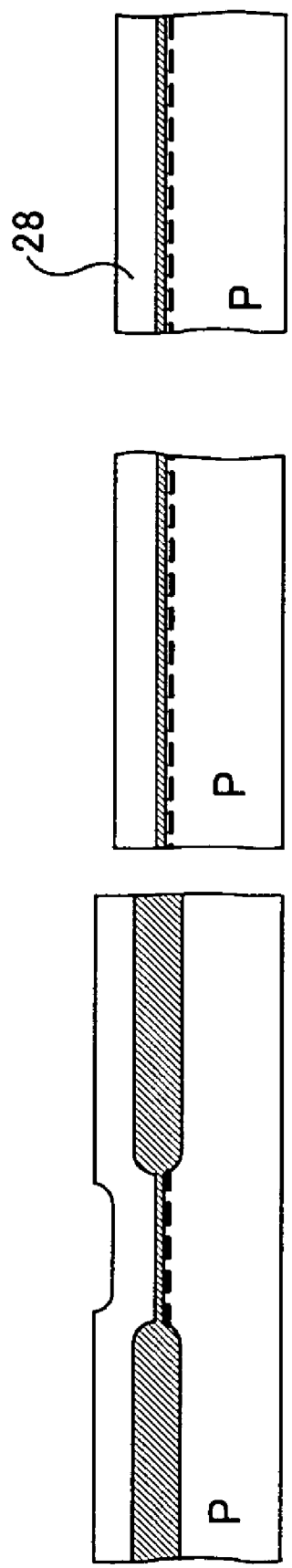
FIG. 13 is a cross-sectional schematic diagram for explaining a method for manufacturing the FLASH EPROM which is an example of the method for manufacturing a semiconductor device of the present invention, and showing a step after the step shown in FIG. 12.

A first polysilicon film (first conductive film) 28 having a thickness of 50 nm to 200 nm (500 to 2,000 angstroms) was formed on the entire surface of the article as a floating gate electrode of the MOS transistor of the memory cell unit (the left and central views in FIG. 13) and as a gate electrode of the MOS transistor in the peripheral circuit unit (the right view in FIG. 13).

Figure 14:
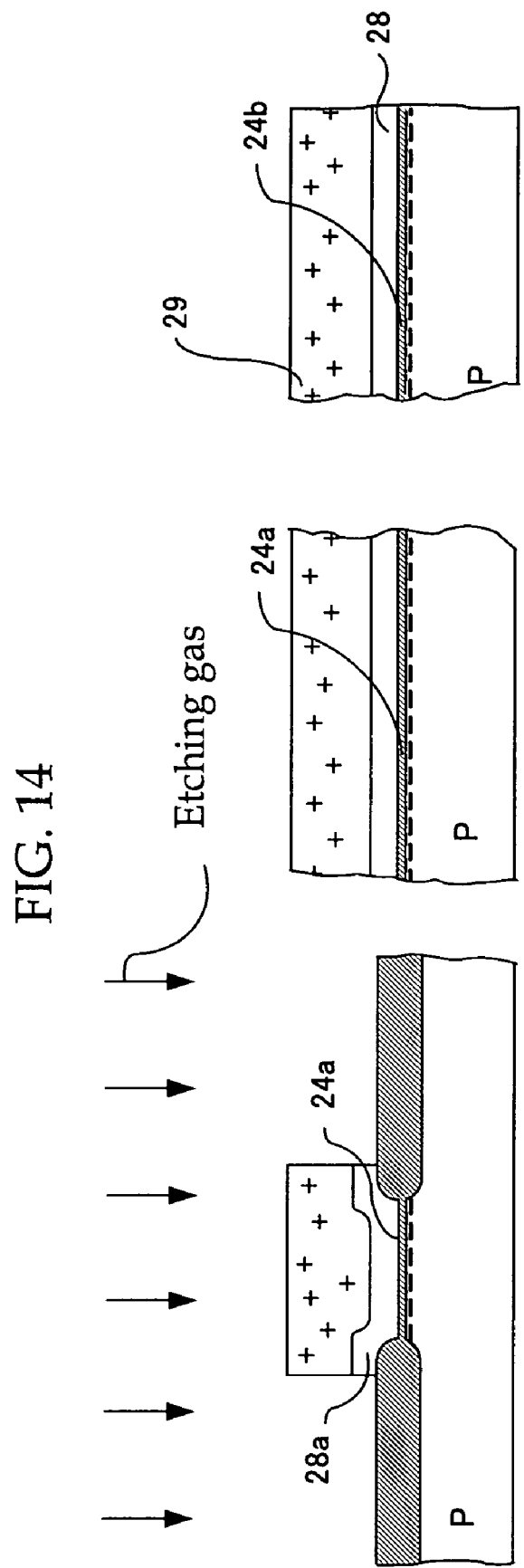
FIG. 14 is a cross-sectional schematic diagram for explaining a method for manufacturing the FLASH EPROM which is an example of the method for manufacturing a semiconductor device of the present invention, and showing a step after the step shown in FIG. 13.

With reference to FIG. 14, a resist film 29 was then formed, the first polysilicon film 28 was patterned using the resist film 29 as a mask and thereby yielded a floating gate electrode 28a in the MOS transistor in the memory cell unit (the left and central views in FIG. 14). In this procedure, the first polysilicon film 28 was patterned in the X direction to be intended dimensions and was not patterned in the Y direction to thereby leave a region to be a source-drain (S/D) layer covered by the resist film 29.

Figure 15:
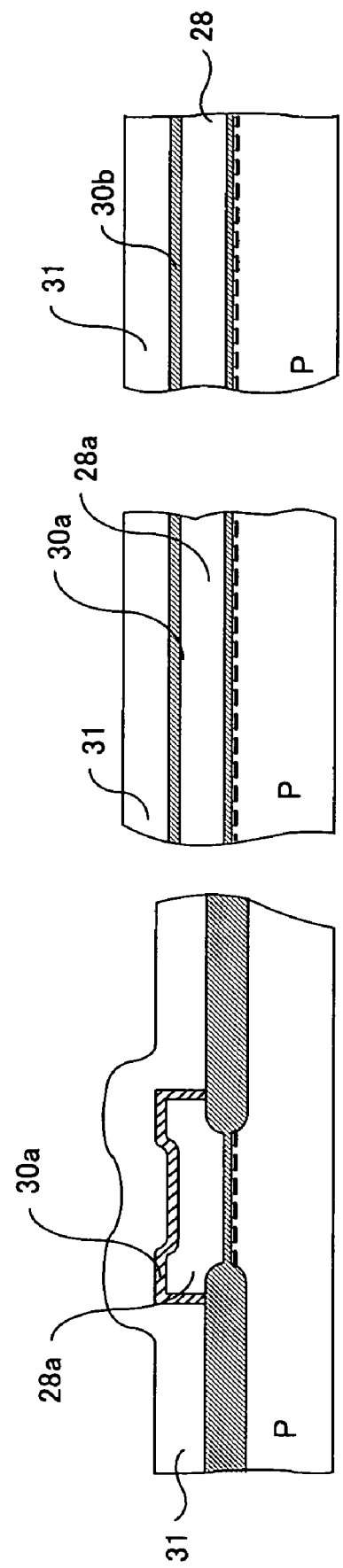
FIG. 15 is a cross-sectional schematic diagram for explaining a method for manufacturing the FLASH EPROM which is an example of the method for manufacturing a semiconductor device of the present invention, and showing a step after the step shown in FIG. 14.

The resist film 29 was stripped, a capacitor dielectric film 30a made of a $SiO_2$ film was formed by thermal oxidation so as to cover the floating gate electrode 28a and to have a thickness of about 20 nm to 50 nm (200 to about 500 angstroms) (the left and central views in FIG. 15). In this procedure, a capacitor dielectric film 30b made of a $SiO_2$ film was also formed on the first polysilicon film 28 in the peripheral circuit unit (the right view in FIG. 15). These capacitor dielectric films 30a and 30b are made of a $SiO_2$ film alone, however, they may include a multilayer film having two or three layers of $SiO_2$ film and $Si_3N_4$ film.

Next, a second polysilicon film (second conductive film) 31 was formed so as to have a thickness of 50 nm to 200 nm (500 to 2,000 angstroms) so as to cover the floating gate electrode 28a and the capacitor dielectric film 30a (FIG. 15). The second polysilicon film 31 serves as a control gate electrode.

Figure 16:
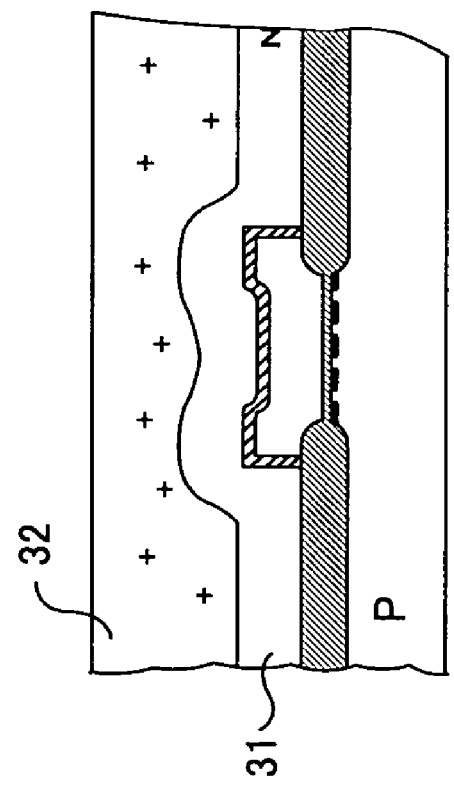
FIG. 16 is a cross-sectional schematic diagram for explaining a method for manufacturing the FLASH EPROM which is an example of the method for manufacturing a semiconductor device of the present invention, and showing a step after the step shown in FIG. 15.

With reference to FIG. 16, the memory cell unit (the left and central views in FIG. 16) was masked by a resist film 32, the second polysilicon film 31 and the capacitor dielectric film 30b in the peripheral circuit unit (the right view in FIG. 16) were stripped in turn by etching to thereby expose the first polysilicon film 28 from the surface.

Figure 17:
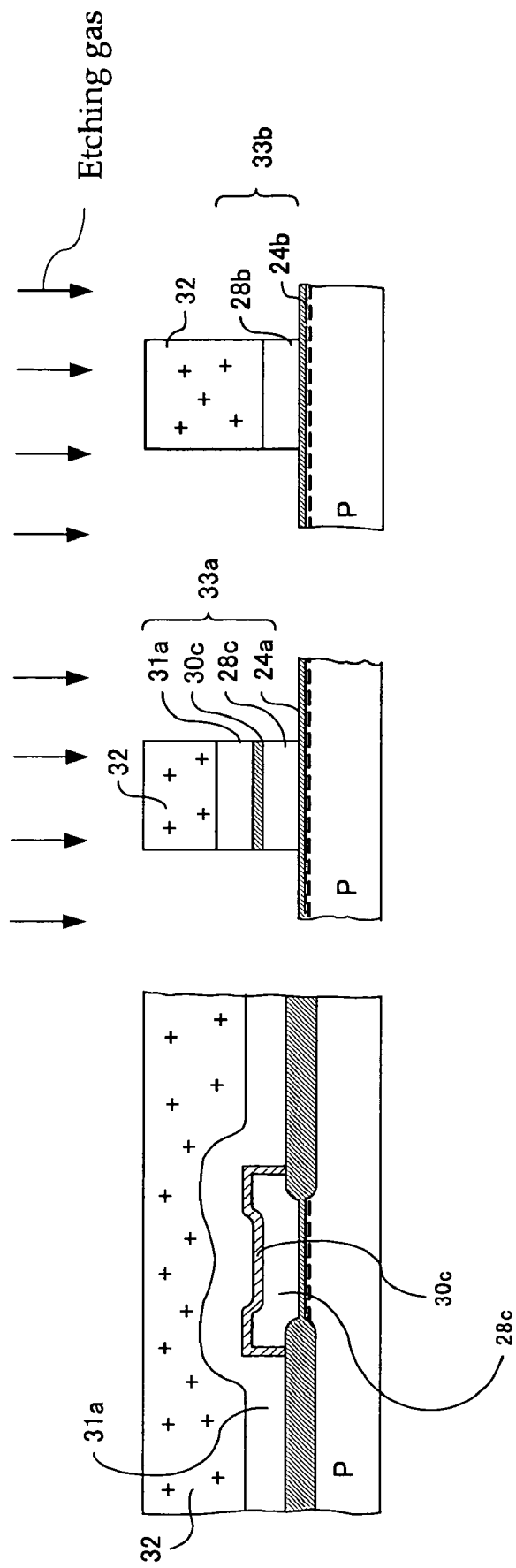
FIG. 17 is a cross-sectional schematic diagram for explaining a method for manufacturing the FLASH EPROM which is an example of the method for manufacturing a semiconductor device of the present invention, and showing a step after the step shown in FIG. 16.
Figure 18:
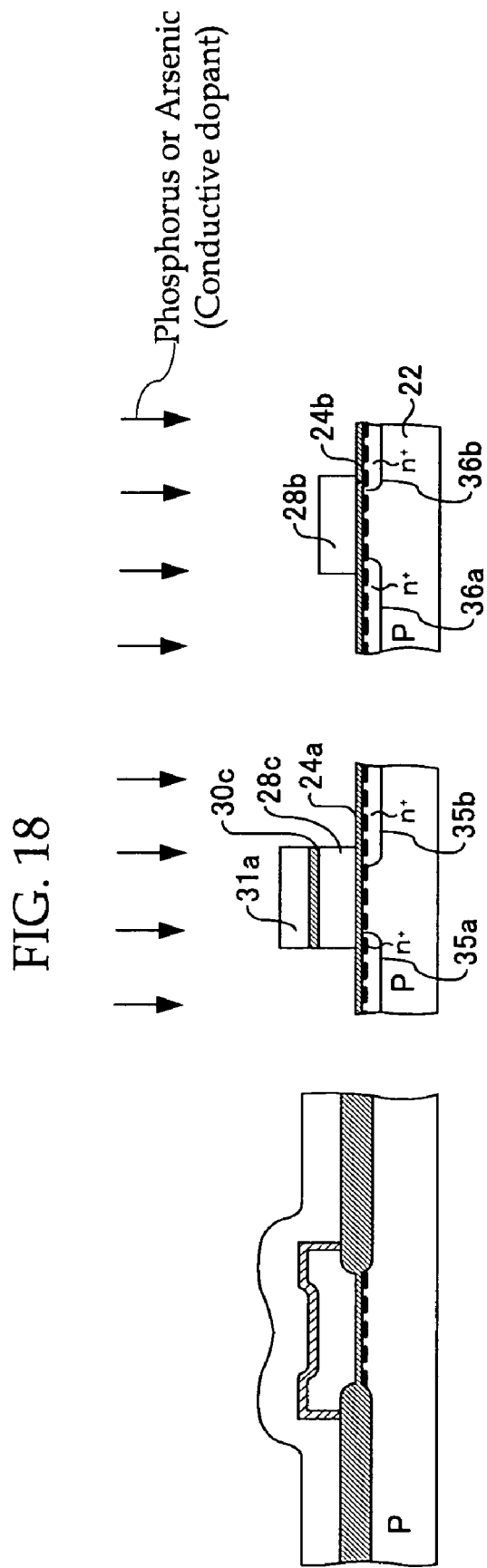
FIG. 18 is a cross-sectional schematic diagram for explaining a method for manufacturing the FLASH EPROM which is an example of the method for manufacturing a semiconductor device of the present invention, and showing a step after the step shown in FIG. 17.

With reference to FIG. 17, the second polysilicon film 31, the capacitor dielectric film 30a, and the first polysilicon film 28a of the memory cell unit (the left and central views in FIG. 17), which first polysilicon film 28a had been patterned only in the X direction, were patterned in the Y direction to target dimensions of a first gate unit 33a using the resist film 32 as a mask. Thus, a multilayer assemblage of a control gate electrode 31a, a capacitor dielectric film 30c, and a floating gate electrode 28c having a width of about 1 µm in the Y direction was formed. In addition, the first polysilicon film 28 in the peripheral circuit unit (the right view in FIG. 17) was patterned to target dimensions of a second gate unit 33b and thereby yielded a gate electrode 28b about 1 µm wide.

Phosphorus (P) or arsenic (As) was injected into the element forming region of the Si substrate 22 by ion implantation at a dose of $1 \times 10^{14}$ $cm^{-2}$ to $1 \times 10^{16}$ $cm^{-2}$ using, as a mask, the multilayer assemblage of the control gate electrode 31a, the capacitor dielectric film 30c, and the floating gate electrode 28c in the memory cell unit (the left and central views in FIG. 18) and thereby yielded n-type source and drain (S/D) region layers 35a and 35b. In addition, phosphorus (P) or arsenic (As) as an n-type dopant was injected into the element forming region of the Si substrate 22 by ion implantation at a dose of $1 \times 10^{14}$ $cm^{-2}$ to $1 \times 10^{16}$ $cm^{-2}$ using the gate electrode 28b in the peripheral circuit unit (the right view in FIG. 18) as a mask and thereby yielded S/D region layers 36a and 36b.

Figure 19:
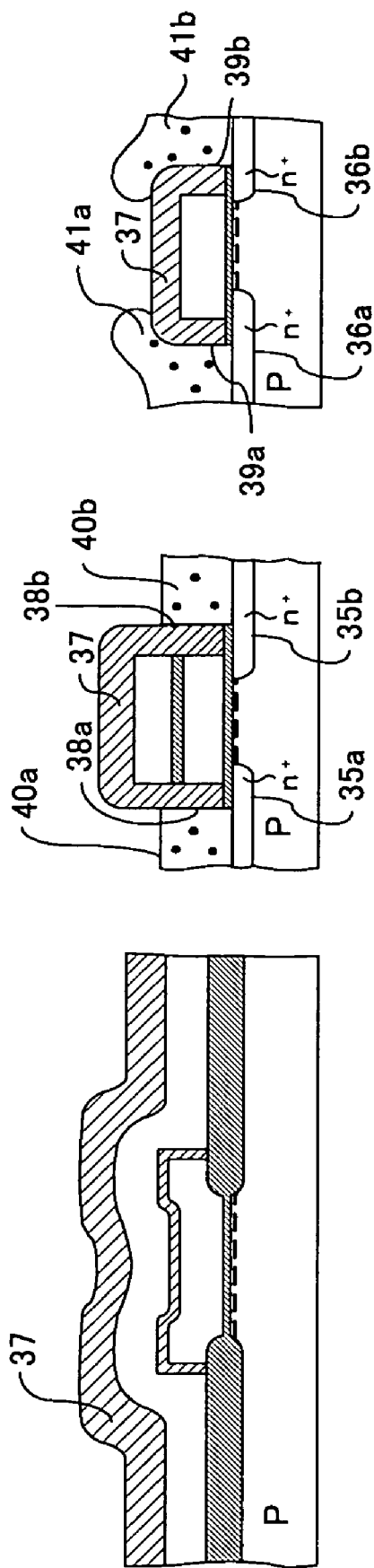
FIG. 19 is a cross-sectional schematic diagram for explaining a method for manufacturing the FLASH EPROM which is an example of the method for manufacturing a semiconductor device of the present invention, and showing a step after the step shown in FIG. 18.

A phosphate-silicate glass film (PSG film) about 500 nm (5000 angstroms) thick was formed as an interlayer dielectric film 37 so as to cover the first gate unit 33a in the memory cell unit (the left and central views in FIG. 19) and the second gate unit 33b in the peripheral circuit unit (the right view in FIG. 19).

Subsequently, contact holes 38a, 38b, 39a, and 39b were formed on the interlayer dielectric film 37 on the S/D region layers 35, 35b, 36a, and 36b, respectively. S/D electrodes 40a, 40b, 41a and 41b were then formed respectively. In order to form the contact holes 38a, 38b, 39a and 39b, the hole pattern was formed from the resist material and then thickened the resist pattern with the resist pattern thickening material according to the present invention, thereby forming fine space pattern of resists (hole patterns). Thereafter, the contact holes were manufactured in accordance with a conventional method.

Thus, the FLASH EPROM as a semiconductor device was manufactured (FIG. 19).

In the above-manufactured FLASH EPROM, the second gate dielectric film 24b in the peripheral circuit unit (the right views in FIGS. 11 through 19) remains being covered by the first polysilicon film 28 or the gate electrode 28b after its formation (the right views in FIGS. 11 through 19) and thereby keeps its initial thickness. Accordingly, the thickness of the second gate dielectric film 24b can be easily controlled, and the concentration of a conductive dopant can be easily controlled for the control of the threshold voltage.

In this embodiment, the first gate unit 33a is formed by initially patterning in the gate width direction (the X direction in FIGS. 9 and 10) to a set width and then patterning in the gate length direction (the Y direction in FIGS. 9 and 10) to a target width. Alternatively, the first gate unit 33a may be formed by initially patterning in the gate length direction (the Y direction in FIGS. 9 and 10) to a set width and then patterning in the gate width direction (the X direction in FIGS. 9 and 10) to a target width.

Figure 20:
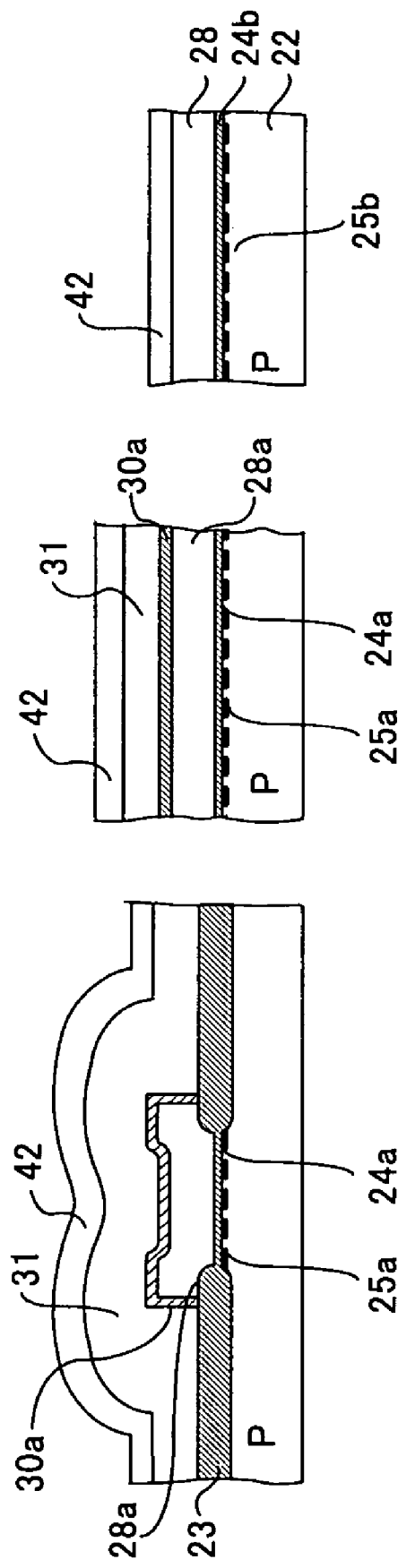
FIG. 20 is a cross-sectional schematic diagram for explaining the method for manufacturing the FLASH EPROM which is another example of the method for manufacturing a semiconductor device of the present invention.
Figure 21:
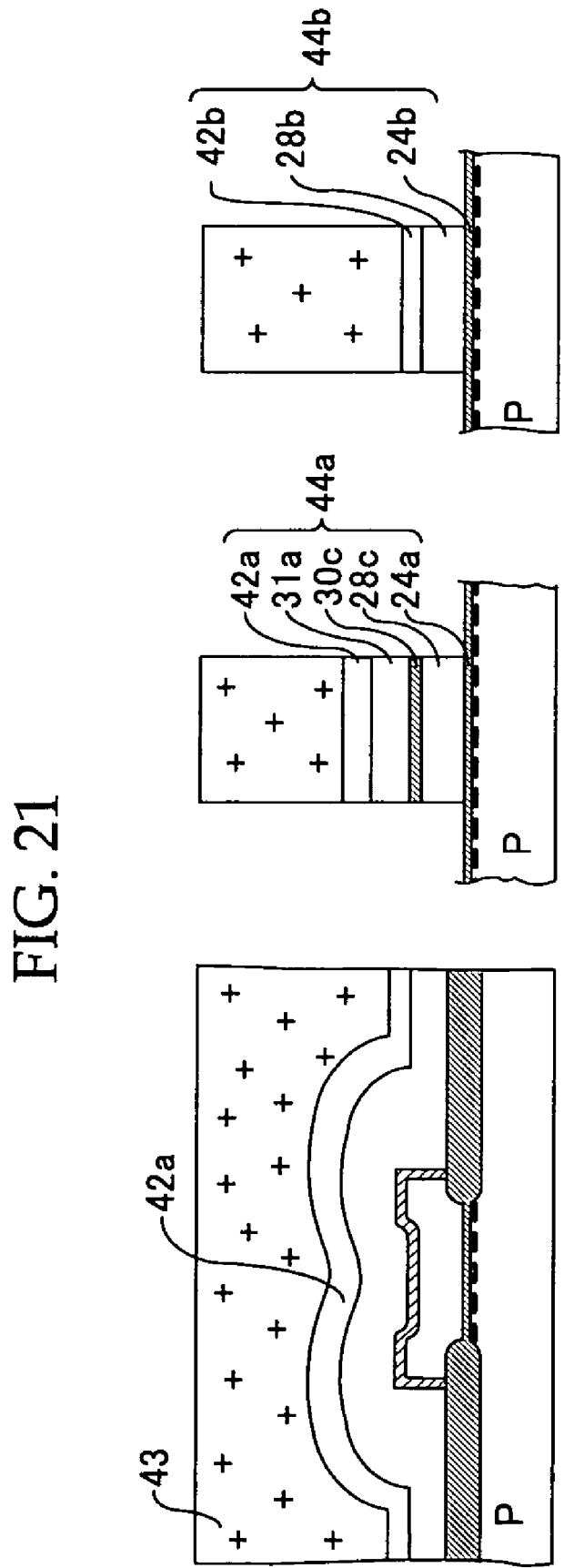
FIG. 21 is a cross-sectional schematic diagram for explaining the method for manufacturing the FLASH EPROM which is another example of the method for manufacturing a semiconductor device of the present invention, and showing a step after the step shown in FIG. 20.

Another FLASH EPROM was manufactured in the same way as in the above embodiment, except that the steps subsequent to the step of FIG. 19 were changed to those shown in FIGS. 20, 29 and 30. This manufacture is similar to the above embodiment, except for the followings. Specifically, a tungsten (W) film or a titanium (Ti) film about 200 nm (2,000 angstroms) thick was formed as a refractory metal film (fourth conductive film) 42 on the second polysilicon film 31 in the memory cell unit (the left and central views in FIG. 20) and the first polysilicon film 28 in the peripheral circuit unit (the right view in FIG. 20) and thereby yielded a polycide film. The steps of FIGS. 21 and 22 subsequent to the step of FIG. 20 were carried out in the same manner as in FIGS. 17, 18, and 19 and a detail description thereof is omitted. The same components in FIGS. 20, 21, and 22 as in FIGS. 17, 18, and 19 have the same reference numerals.

Figure 22:
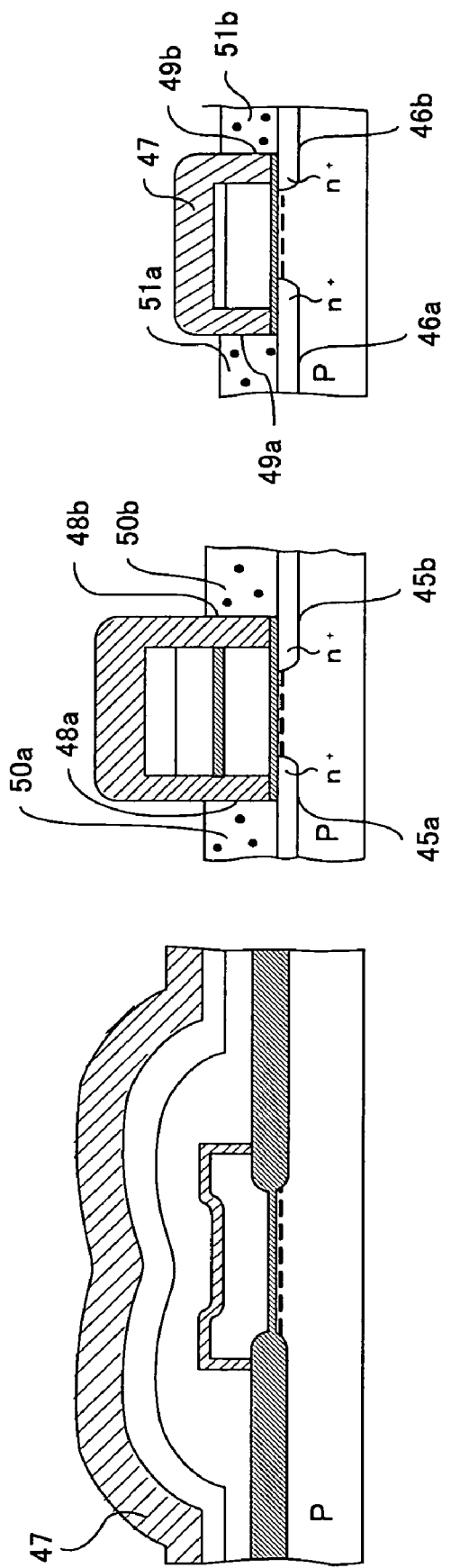
FIG. 22 is a cross-sectional schematic diagram for explaining the method for manufacturing the FLASH EPROM which is another example of the method for manufacturing a semiconductor device of the present invention, and showing a step after the step shown in FIG. 21.

Thus, a FLASH EPROM as a semiconductor device was manufactured (FIG. 22).

The above-manufactured FLASH EPROM has the refractory metal films (fourth conductive films) 42a and 42b on the control gate electrode 31a and the gate electrode 28b and can thereby further reduce its electrical resistance.

In this embodiment, the refractory metal films 42a and 42b are used as the fourth conductive films. Alternatively, refractory metal silicide films such as titanium silicide (TiSi) films can be used.

Figure 23:
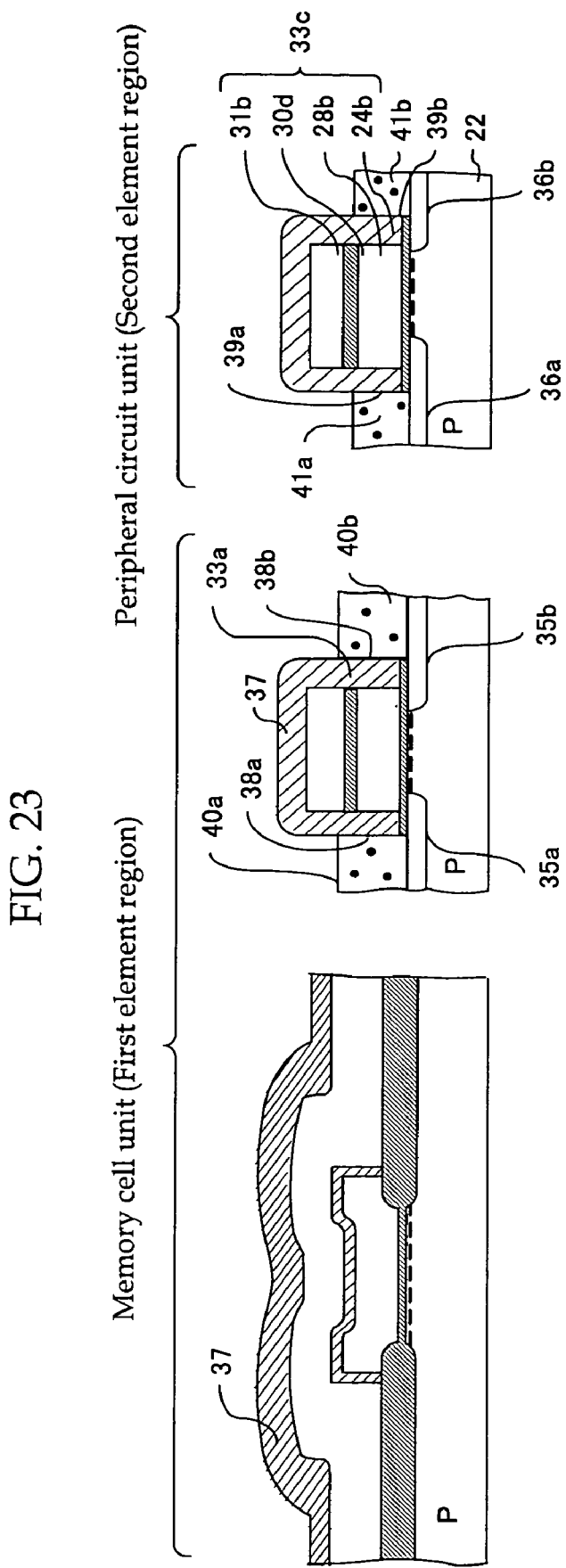
FIG. 23 is a cross-sectional schematic diagram for explaining the method for manufacturing the FLASH EPROM which is yet another example of the method for manufacturing a semiconductor device of the present invention.
Figure 24:
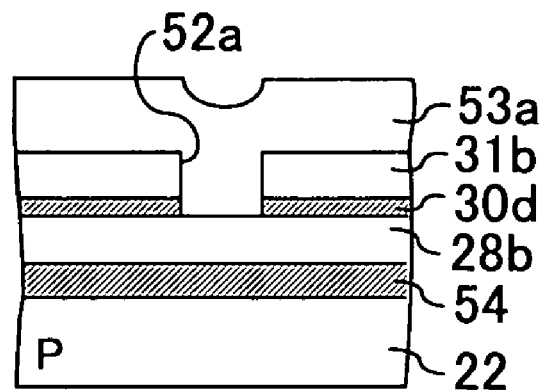
FIG. 24 is a cross-sectional schematic diagram for explaining the method for manufacturing the FLASH EPROM which is yet another example of the method for manufacturing a semiconductor device of the present invention, and showing a step after the step shown in FIG. 23.
Figure 25:
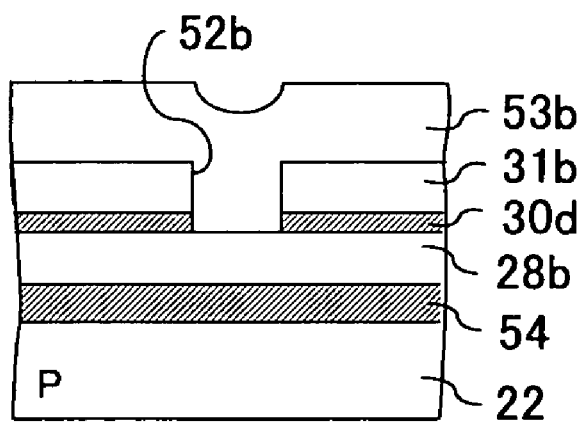
FIG. 25 is a cross-sectional schematic diagram for explaining the method for manufacturing the FLASH EPROM which is yet another example of the method for manufacturing a semiconductor device of the present invention, and showing a step after the step shown in FIG. 24.

Yet another FLASH EPROM was manufactured by the manufacture procedure as in the above-mentioned embodiment, except for steps shown in FIGS. 23, 24, and 25. Specifically, a second gate unit 33c in the peripheral circuit unit (second element region) (the right view in FIG. 23) has a multilayer structure equipped with a first polysilicon film (first conductive film) 28b, a $SiO_2$ film (capacitor dielectric film) 30d, and a second polysilicon film (second conductive film) 31b arranged in this order as in the first gate unit 33a in the memory cell unit (the left and central views in FIG. 23). The first polysilicon film 28b and the second polysilicon film 31b are bridged and thereby form a gate electrode (FIGS. 24 and 25).

More specifically, with reference to FIG. 24, the first polysilicon film 28b and the second polysilicon film 31b are bridged by forming an opening 52a penetrating the first polysilicon film (first conductive film) 28b, the $SiO_2$ film (capacitor dielectric film) 30d and the second polysilicon film (second conductive film) 31b at another portion than the second gate unit 33c shown in FIG. 23, for example, on the dielectric film 54, and filling the opening 52a with a refractory metal film (third conductive film) 53a such as a W film or a Ti film. Alternatively, with reference to FIG. 25, the first polysilicon film 28b and the second polysilicon film 31b may be bridged by forming an opening 52b penetrating the first polysilicon film (first conductive film) 28b and the $SiO_2$ film (capacitor dielectric film) 30d, thereby exposing the lower first polysilicon film 28b at the bottom of the opening 52b, and filling the opening 52b with a refractory metal film 53b such as a W film or a Ti film.

In the above-manufactured FLASH EPROM, the second gate unit 33c in the peripheral circuit unit has the same structure as the first gate unit 33a in the memory cell unit. Accordingly, the memory cell unit and the peripheral circuit unit can be formed by the same step to thereby efficiently simplify steps of the manufacture process.

In this embodiment, the third conductive film 53a or 53b and the refractory metal film (fourth conductive film) 42 were formed independently. Alternatively, these films may be formed simultaneously as a refractory metal film in common.

The present invention aims at solving the shortcomings in the prior art, and can achieve the following objects.

The present invention can provide a resist composition, which can utilize ArF excimer laser light, for example, as an exposure light during patterning; which is suitably utilized when a resist pattern thickening material is applied over a surface of a resist pattern which has been formed by exposure of light and developing so as to uniformly thicken a resist pattern, e.g., in form of space pattern, with the resist pattern thickening material regardless of the direction, spacing variations and the like of the formed resist pattern and without depending on the components of the resist pattern thickening material; which is capable of forming a fine space pattern of resist, exceeding exposure or resolution limits of light sources of available exposure devices at low cost, easily and efficiently.

The present invention can also provide a method for forming a resist pattern which, during patterning a resist pattern, can utilize ArF excimer laser light as an exposure light; which can thicken a resist pattern, e.g., in form of space pattern, regardless of the direction, spacing variations and the like of the resist pattern and without depending on the components of the resist pattern thickening material; and which is capable of forming a fine space pattern of resist, exceeding exposure or resolution limits of light sources of available exposure devices at low cost, easily and efficiently.

In addition, the present invention can provide a method for manufacturing a semiconductor device in which, during patterning a resist pattern, ArF excimer laser light can be utilized as a light source; a fine space pattern of resist, exceeding exposure or resolution limits of light sources of available exposure devices, can be formed, regardless of the direction, spacing variations and the like of the resist pattern and without depending on the components of the resist pattern thickening material; and high-performance semiconductor devices having fine interconnection patterns formed by using the space pattern of resist can be efficiently mass produced, and is to provide a high-performance semiconductor which is manufactured by the method for manufacturing a semiconductor device and has fine interconnection patterns.

The resist composition of the present invention is suitably utilized when a resist pattern thickening material is applied over a surface of a resist pattern which has been formed by exposure of light and developing so as to uniformly thicken a resist pattern, e.g., in form of space pattern, with the resist pattern thickening material regardless of the direction, spacing variations and the like of the formed resist pattern and without depending on the components of the resist pattern thickening material; which is capable of forming a fine space pattern of resist, exceeding exposure or resolution limits of light sources of available exposure devices at low cost, easily and efficiently. Thus the resist composition of the present invention is suitably applicable for a variety of patterning method, semiconductor device manufacturing process, etc. and particularly suitably applicable for a method for forming a resist pattern and method for manufacturing a semiconductor device of the present invention.

The method for forming a resist pattern of the present invention is suitably applicable for manufacturing functional parts such as mask patterns, reticule patterns, magnetic heads, LCDs (liquid crystal displays), PDPs (plasma display panels), SAW filters (surface acoustic wave filters); optical parts used in connecting optical wiring; fine parts such as microactuators; semiconductor devices; and the like, and can be suitably employed in the method for manufacturing a semiconductor device of the present invention.

The method for manufacturing a semiconductor device of the present invention is suitably applicable for a manufacturing procedure of various semiconductor devices, such as flash memory, DRAMs, FRAMs and the like.

What is claimed is:

1. A resist composition comprising:
   an alicyclic compound; and
   a resin
   wherein the alicyclic compound is at least any one of adamantane compounds and norbornane compounds, wherein the adamantane compounds are represented by the following Structural Formulae (1) to (5), and the norbornane compounds are represented by the following Structural Formulae (6) to (8), and
   wherein the resist composition does not comprise water

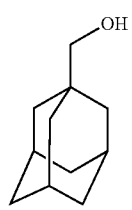

Structural Formula (1)

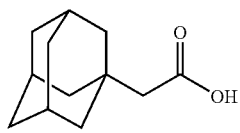

Structural Formula (2)

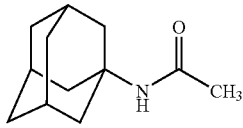

Structural Formula (3)

-continued

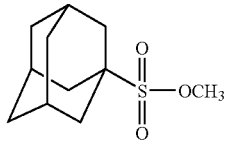

Structural Formula (4)

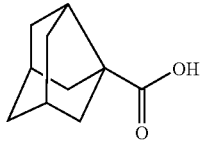

Structural Formula (5)

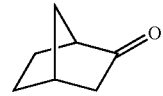

Structural Formula (6)

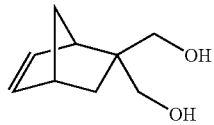

Structural Formula (7)

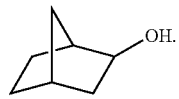

Structural Formula (8)

2. The resist composition according to claim 1, wherein the resin is at least one selected from acrylic resists, cycloolefin-maleic acid anhydride resists and cycloolefin resists.

3. The resist composition according to claim 1, wherein the content of the alicyclic compound is 0.01% by mass to 5% by mass relative to the mass of the resin.

4. The resist composition according to claim 1, wherein the resist composition is exposed with at least one selected from the group consisting of g-rays, i-rays, KrF excimer laser light, ArF excimer laser light, $F_2$ excimer laser light, EUV light, electron beams, and x-rays.

5. A method for forming a resist pattern comprising:
   forming a resist pattern on a surface of a workpiece to be processed by using a resist composition; and
   applying a resist pattern thickening material on the surface of the workpiece so as to cover the surface of the resist pattern,
   wherein the resist composition comprises at least an alicyclic compound and a resin, wherein the alicyclic compound is at least any one of adamantane compounds and norbornane compounds, wherein the adamantane compounds are represented by the following Structural Formulae (1) to (5), and the norbornane compounds are represented by the following Structural Formulae (6) to (8), and
   wherein the resist composition does not comprise water

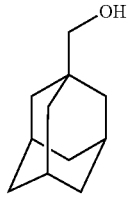

Structural Formula (1)

-continued

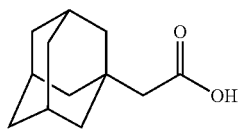
Structural Formula (2)

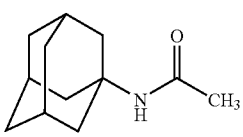
Structural Formula (3)

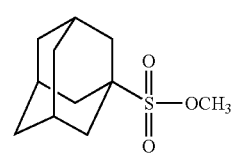
Structural Formula (4)

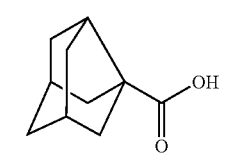
Structural Formula (5)

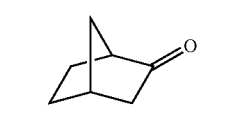
Structural Formula (6)

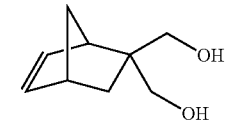
Structural Formula (7)

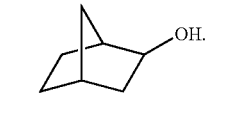
Structural Formula (8)

6. The method for forming a resist pattern according to claim 5, wherein the resist pattern thickening material is water-soluble or alkali-soluble.

7. The method for forming a resist pattern according to claim 6, wherein the resist pattern thickening material comprises any one of a water-soluble resin and an alkali-soluble resin, and the resin is at least one selected from the group consisting of polyvinyl alcohols, polyvinyl acetals, polyvinyl acetates, and tannins.

8. The method for forming a resist pattern according to claim 5, wherein the resist pattern thickening material comprises a crosslinker, and the crosslinker is at least one selected from the group consisting of melamine derivatives, urea derivatives, and uril derivatives.

9. The method for forming a resist pattern according to claim 5, wherein the resist pattern thickening material comprises a compound represented by the following General Formula (1):

General Formula (2)

where X represents a functional group represented by the following General Formula (2); Y represents at least one selected from the group consisting of hydroxyl groups, amino groups, amino groups substituted with alkyl groups, alkoxy groups, alkoxy-carbonyl groups, and alkyl groups; the number of substitutions is an integer of 0 to 3; "m" is an integer of 1 or more, and "n" is an integer of 0 or more

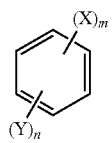
General Formula (1)

where $R^1$ and $R^2$ may be the same to each other or different from each other, and respectively represent hydrogen or a substituent group; Z represents at least one selected from the group consisting of hydroxyl groups, amino groups, amino groups substituted with alkyl groups, and alkoxy groups; and the number of substitutions is an integer of 0 to 3.

10. The method for forming a resist pattern according to claim 9, wherein in the General Formula (1), "m" is an integer of 1.

11. The method for forming a resist pattern according to claim 5, wherein the resist pattern thickening material comprises a surfactant, and the surfactant is at least one selected from the group consisting of polyoxyethylene-polyoxypropylene condensation compounds, polyoxy alkylene alkyl ether compounds, polyoxyethylene alkyl ether compounds, polyoxyethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid ester compounds, amide compounds, natural alcohol compounds, ethylenediamine compounds, secondary alcohol ethoxylate compounds, alkyl cationic compounds, amide quaternary cationic compounds, ester quaternary cationic compounds, amine oxide compounds, and betaine compounds.

12. The method for forming a resist pattern according to claim 5, further comprising heating the surface of the resist pattern with the resist pattern thickening material applied thereon.

13. The method for forming a resist pattern according to claim 12, wherein the resist pattern is heated at a temperature near the melting point of the alicyclic compound in the resist composition.

14. The method for forming a resist pattern according to claim 13, wherein the heating temperature is the melting temperature of the alicyclic compound or more.

15. The method for forming a resist pattern according to claim 5, further comprising subjecting the surface of the resist pattern with the resist pattern thickening material applied thereon to a developing treatment.

16. The method for forming a resist pattern according to claim 15, wherein the developing treatment is performed using at least water.

17. A method for manufacturing a semiconductor device comprising:

forming a resist pattern on a surface of a workpiece to be processed by using a resist composition, and by applying a resist pattern thickening material over the surface of the workpiece so as to cover the surface of the resist pattern to thereby thicken the resist pattern; and patterning the surface of the workpiece by etching the surface of the workpiece using the thickened resist pattern as a mask,
wherein the resist composition comprises an alicyclic compound and a resin, wherein the alicyclic compound is at least any one of adamantane compounds and norbornane compounds, wherein the adamantane compounds are represented by the following Structural Formulae (1) to (5), and the norbornane compounds are represented by the following Structural Formulae (6) to (8), and
wherein the resist composition does not comprise water Structural Formula (1)

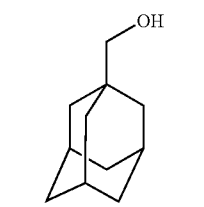

Structural Formula (2)

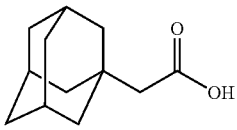

Structural Formula (3)

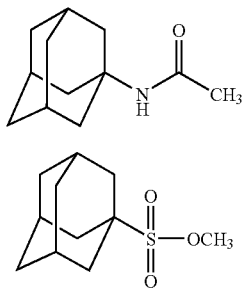

Structural Formula (4)

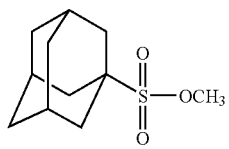

Structural Formula (5)

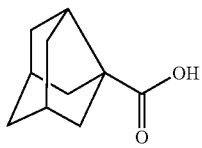

Structural Formula (6)

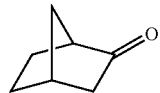

Structural Formula (7)

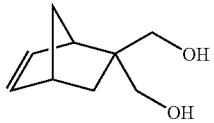

Structural Formula (8)

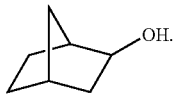

18. The method for manufacturing a semiconductor device according to claim 17, further comprising applying a nonionic surfactant over a surface of the resist pattern before forming the thickened resist pattern, wherein the nonionic surfactant is at least one selected from the group consisting of polyoxyethylene-polyoxypropylene condensation compounds, polyoxy alkylene alkyl ether compounds, polyoxyethylene alkyl ether compounds, polyoxyethylene derivative compounds, sorbitan fatty acid ester compounds, glycerine fatty acid ester compounds, primary alcohol ethoxylate compounds, and phenol ethoxylate compounds.

* * * * *

UNITED STATES PATENT AND TRADEMARK OFFICE
CERTIFICATE OF CORRECTION

PATENT NO.       : 7,611,819 B2                              Page 1 of 1
APPLICATION NO.  : 11/476172
DATED            : November 3, 2009
INVENTOR(S)      : Nozaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 116 days.

Signed and Sealed this

Twelfth Day of October, 2010

David J. Kappos
*Director of the United States Patent and Trademark Office*